US012796563B2

(12) United States Patent
Park et al.

(10) Patent No.: US 12,796,563 B2
(45) Date of Patent: Nov. 10, 2026

(54) SEMICONDUCTOR PACKAGE

(71) Applicant: SAMSUNG ELECTRONICS CO., LTD., Suwon-si (KR)

(72) Inventors: Jinwoo Park, Suwon-si (KR); Unbyoung Kang, Suwon-si (KR); Chungsun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 454 days.

(21) Appl. No.: 18/481,823

(22) Filed: Oct. 5, 2023

(65) Prior Publication Data

US 2024/0186277 A1 Jun. 6, 2024

(30) Foreign Application Priority Data

Dec. 1, 2022 (KR) ........................ 10-2022-0165402
May 8, 2023 (KR) ........................ 10-2023-0058906

(51) Int. Cl.

*H10W 90/00* (2026.01)
*H10B 80/00* (2026.01)
*H10W 72/00* (2026.01)
*H10W 72/20* (2026.01)
*H10W 72/30* (2026.01)
*H10W 74/15* (2026.01)
*H10W 90/20* (2026.01)

(52) U.S. Cl.

CPC ............. *H10W 90/00* (2026.01); *H10B 80/00* (2023.02); *H10W 72/07353* (2026.01); *H10W 72/263* (2026.01); *H10W 72/267* (2026.01); *H10W 72/334* (2026.01); *H10W 72/383* (2026.01); *H10W 74/15* (2026.01); *H10W 90/20* (2026.01); *H10W 90/297* (2026.01); *H10W 90/722* (2026.01); *H10W 90/732* (2026.01)

(58) Field of Classification Search

CPC .... H10W 90/00; H10W 72/851; H10W 72/20
See application file for complete search history.

(56) References Cited

U.S. PATENT DOCUMENTS 10,020,290 B2 7/2018 Choe et al.
11,069,661 B1 * 7/2021 Chen .................... H10W 90/00
11,217,540 B2 1/2022 Kim
2013/0234320 A1 * 9/2013 Lu .................... H10W 72/0198 257/737
2016/0031707 A1 2/2016 Greenwood et al.
2018/0102332 A1 4/2018 Kim et al.
(Continued)

FOREIGN PATENT DOCUMENTS

CN 108321142 8/2020
CN 114597180 6/2022

*Primary Examiner* — Matthew L Reames
(74) *Attorney, Agent, or Firm* — Morgan, Lewis & Bockius LLP

(57) ABSTRACT

A semiconductor package includes a plurality of semiconductor chips that face each other, a plurality of bumps disposed on a front surface or a rear surface of one of the plurality of semiconductor chips, an underfill layer that surrounds the plurality of bumps, and a plurality of insulating frames spaced apart from each other on the front or rear surface of one of the plurality of semiconductor chips. The plurality of insulating frames overlap a plurality of corner regions of the one of the plurality of semiconductor chips in a direction in which the plurality of semiconductor chips face each other.

19 Claims, 18 Drawing Sheets

1000A

(56) References Cited

U.S. PATENT DOCUMENTS

| | | | |
|---|---|---|---|
| 2018/0350630 | A1 | 12/2018 | Kang et al. |
| 2020/0185357 | A1 | 6/2020 | Byun et al. |
| 2020/0219833 | A1 | 7/2020 | Lee et al. |
| 2020/0348594 | A1 | 11/2020 | Koh et al. |
| 2021/0366878 | A1 | 11/2021 | Byun et al. |
| 2022/0262769 | A1 | 8/2022 | Oh et al. |

* cited by examiner

SEMICONDUCTOR PACKAGE

CROSS-REFERENCE TO RELATED APPLICATION(S)

This application claims priority under 35 U.S.C. 119(a) from Korean Patent Application No. 10-2022-0165402, filed on Dec. 1, 2022, and Korean Patent Application No. 10-2023-0058906, filed on May 8, 2023 in the Korean Intellectual Property Office, the contents of both of which are herein incorporated by reference in their entireties.

TECHNICAL FIELD

Embodiments of the present inventive concept are directed to a semiconductor package.

DISCUSSION OF THE RELATED ART

With the reduction of weight and increasing performance of electronic devices, miniaturization and high performance are required in the semiconductor package field. To implement miniaturization, light weight high performance, high capacity and high reliability in semiconductor packages, research into and development of a semiconductor package that has a structure in which semiconductor chips are stacked in multiple stages has been continuously conducted.

SUMMARY

Embodiments provide a semiconductor package in which reliability of a front or rear surface of one of a plurality of semiconductor chips is increased, by, for example, preventing cracking or electrical shorts of multiple bumps, preventing warpage of multiple semiconductor chips, preventing detachment between multiple semiconductor chips, etc.

According to embodiments, a semiconductor package includes a plurality of semiconductor chips that face each other; a plurality of bumps disposed on a front surface or a rear surface of one of the plurality of semiconductor chips; an underfill layer that surrounds the plurality of bumps; and a plurality of insulating frames spaced apart from each other on the front or rear surface of the one of the plurality of semiconductor chips. The plurality of insulating frames overlap a plurality of corner regions of the one of the plurality of semiconductor chips in a direction in which the plurality of semiconductor chips face each other.

According to embodiments, a semiconductor package includes a plurality of semiconductor chips that face each other; a plurality of bumps disposed on a front surface or a rear surface of one of the plurality of semiconductor chips; an underfill layer that surrounds the plurality of bumps; and a plurality of insulating frames spaced apart from each other on the front or rear surface of the one of the plurality of semiconductor chips. An arrangement of the plurality of bumps protrudes toward a space between the plurality of insulating frames.

According to embodiments, a semiconductor package includes a plurality of semiconductor chips that face each other; a plurality of bumps disposed on a front surface or a rear surface of one of the plurality of semiconductor chips; an underfill layer that surrounds the plurality of bumps; and a plurality of insulating frames spaced apart from each other on the front or rear surface of the one of the plurality of semiconductor chips. Each of the plurality of insulating frames has a boundary line that is oblique with respect to remaining boundary lines.

DETAILED DESCRIPTION

Figure 1A:
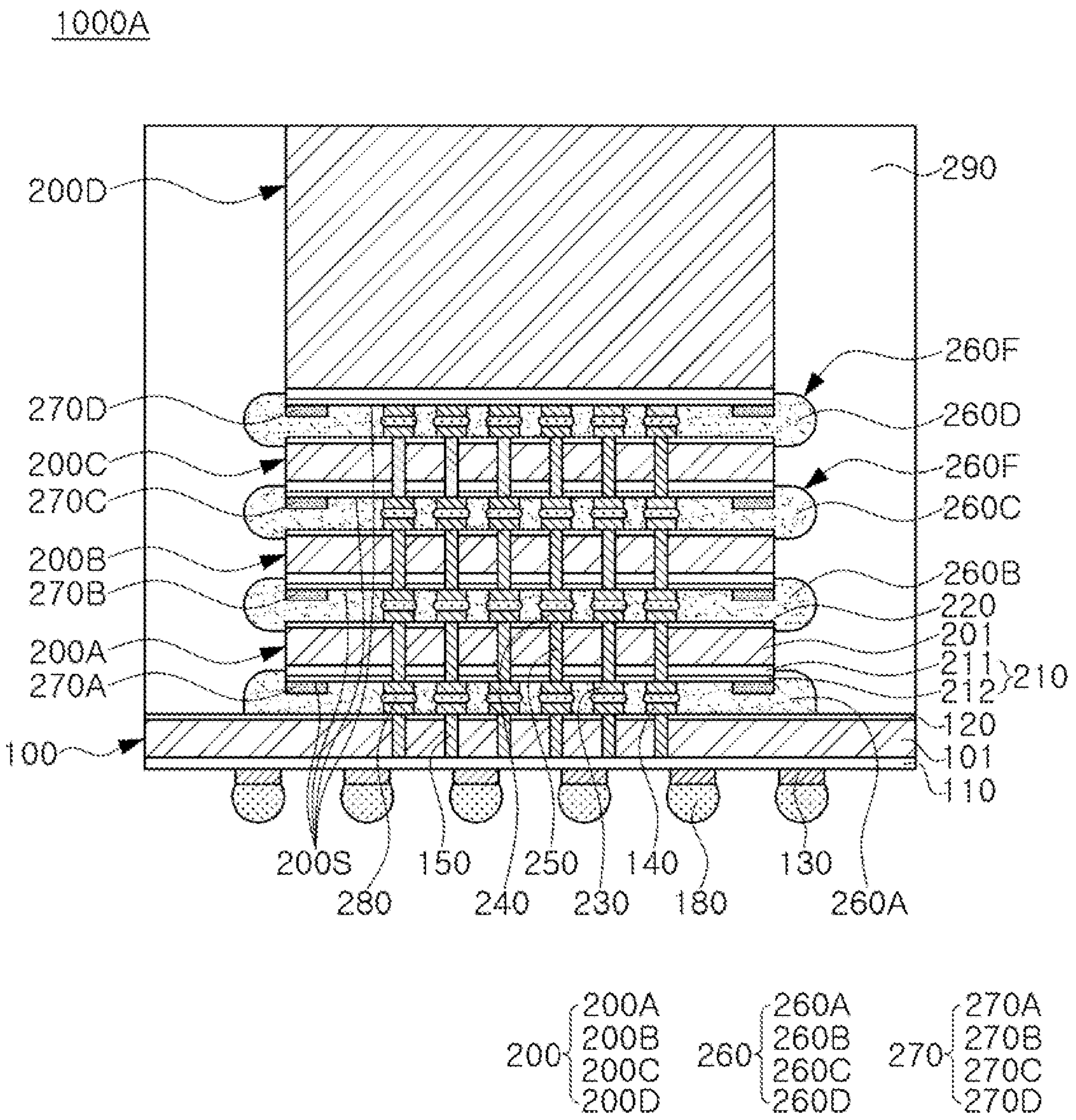
FIG. 1A is a cross-sectional view of a semiconductor package according to an embodiment.

Embodiments of the present inventive concept are described below with reference to the accompanying drawings which, by way of example, illustrate specific embodiments of the present inventive concept. It should be understood that the various embodiments of the present inventive concept are different from each other but are not necessarily mutually exclusive. For example, one embodiment of specific shapes, structures, and characteristics described herein may be implemented in another embodiment without departing from the spirit and scope of the present inventive concept. Additionally, it should be understood that the location or arrangement of individual components within each disclosed embodiment may be changed without departing from the spirit and scope of the present inventive concept. Like reference numbers in the drawings may indicate the same or similar functions throughout the various aspects.

Hereinafter, embodiments of the present inventive concept will be described in detail with reference to the accompanying drawings such that those skilled in the art may easily practice the present inventive concept.

Figure 1B:
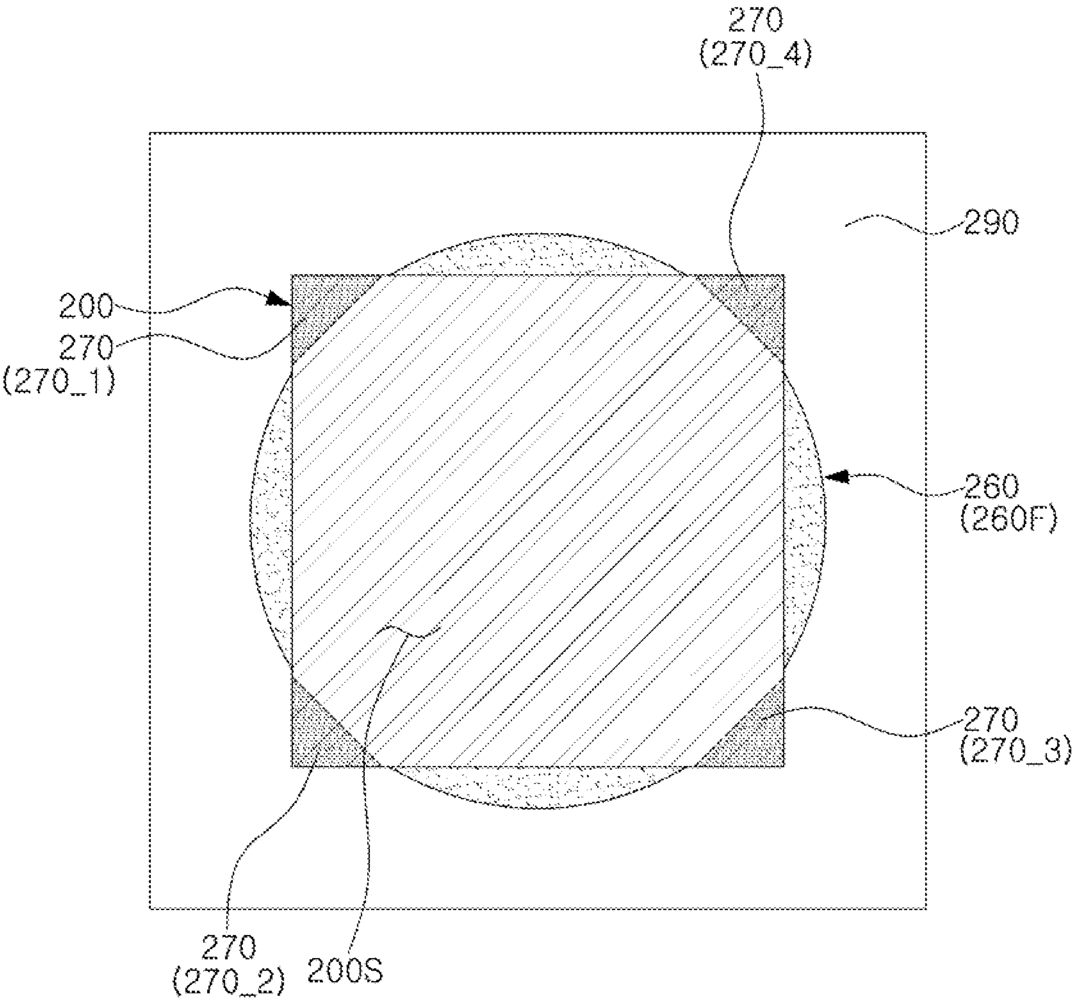
FIG. 1B is a plan view of a semiconductor package according to an embodiment.

FIG. 1A is a cross-sectional view of a semiconductor package according to an embodiment, and FIG. 1B is a plan view illustrating a semiconductor package according to an embodiment.

Referring to FIGS. 1A and 1B, a semiconductor package 1000A according to an embodiment includes a plurality of semiconductor chips 100 and 200, a plurality of underfill layers 260, an encapsulant 290, and a plurality of insulating frames 270. FIG. 1B exemplarily illustrates how the plurality of semiconductor chips 200, the plurality of underfill layers 260, and the plurality of insulating frames 270 are disposed, in a plan view.

The semiconductor chip 100 may include a semiconductor material such as a silicon (Si) wafer. In an embodiment, the semiconductor chip 100 includes a first semiconductor substrate 101, a first front structure 110, a first rear surface passivation layer 120, first front pads 130, first rear pads 140, and first through-electrodes 150 that are through silicon vias (TSVs). Lower bumps 180 connected to the front pads 130 are disposed below the semiconductor chip 100. The semiconductor chip 100 has a width greater than the widths of the plurality of semiconductor chips 200 and may be referred to as a base chip.

The semiconductor chip 100 may be, for example, a buffer chip that includes a plurality of logic elements and/or memory devices disposed on the front structure 110. Accordingly, the semiconductor chip 100 can transmit signals from the plurality of semiconductor chips 200 laminated thereon to external devices through the lower bumps 180, and in addition, can transmit external signals and power to the plurality of semiconductor chips 200. The semiconductor chip 100 may perform both a logic function and a memory function through logic elements and memory elements, but may include only logic elements and perform only a logic function according to embodiments. In an embodiment, the semiconductor chip 100 is an interposer in which a plurality of semiconductor chips 200 are mounted.

The first semiconductor substrate 101 includes, for example, a semiconductor element such as silicon (Si) or germanium (Ge), or a compound semiconductor such as silicon carbide (SiC), gallium arsenide (GaAs), indium arsenide (InAs), or indium phosphide (InP). According to embodiments, the first semiconductor substrate 101 has a silicon on insulator (SOI) structure. The first semiconductor substrate 101 may include a conductive region, such as a well doped with impurities or a structure doped with impurities. The first semiconductor substrate 101 may also include various device isolation structures such as a shallow trench isolation (STI) structure.

The first front structure 110 is disposed on the lower surface of the first semiconductor substrate 101 and may include various types of devices. For example, the first front structure 110 includes a field effect transistor (FET) such as a planar Field Effect Transistor (FET) or a FinFET, a memory device such as a flash memory, a Dynamic Random Access Memory (DRAM), a Static Random Access Memory (SRAM), an Electrically Erasable Programmable Read-Only Memory (EEPROM), a Phase-change Random Access Memory (PRAM), a Magnetoresistive Random Access Memory (MRAM), a ferroelectric random access memory (FeRAM), a resistive random access memory (RRAM), etc., a logic element such as an AND, OR, and NOT gates, and various active and/or passive components such as system Large Scale Integration (LSI), a CMOS Imaging Sensor (CIS), or a Micro-Electro-Mechanical System (MEMS).

The first front structure 110 includes interlayer insulating layers and multilayer wiring layers electrically connected to the elements. The wiring layers electrically connect the elements to each other, electrically connect the elements to the conductive region of the first semiconductor substrate 101, or electrically connect the elements to the lower bumps 180. In an embodiment, the first front structure 110 is protected by a separate passivation layer that includes at least one of silicon oxide, silicon nitride, or silicon oxynitride.

The lower bumps 180 are disposed on the front pads 130 and are electrically connected to the wiring layers or the first through-electrodes 150 inside the first front structure 110. In an embodiment, the lower bumps 180 are formed of solder balls. However, according to embodiments, the lower bumps 180 have a structure that includes pillars and solder. The semiconductor package 1000A can be mounted on an external substrate such as a main board through the lower bumps 180.

The first rear surface passivation layer 120 is disposed on the upper surface of the first semiconductor substrate 101. The first rear surface passivation layer 120 faces front surfaces of the plurality of semiconductor chips 200 and protects the first semiconductor substrate 101.

The first front pads 130 are disposed on the first front structure 110, and the first rear pads 140 are disposed on the first rear surface passivation layer 120. The first front and rear pads 130 and 140 are electrically connected to each other through the first through-electrodes 150. The first front and rear pads 130 and 140 include at least one of, for example, aluminum (Al), copper (Cu), nickel (Ni), tungsten (W), platinum (Pt), or gold (Au).

The first through-electrodes 150 penetrate the first semiconductor substrate 101 in a vertical direction (Z direction) and provide an electrical path that connects the first front and rear pads 130 and 140. Each of the first through-electrodes 150 includes a conductive plug and a barrier film that surrounds the conductive plug. The conductive plug includes a metal such as tungsten (W), titanium (Ti), aluminum (Al), or copper (Cu). The conductive plug may be formed through a plating process, a PVD process, or a CVD process. The barrier layer includes an insulating barrier layer and/or a conductive barrier layer. The insulating barrier layer is formed of one of an oxide layer, a nitride layer, a carbide layer, a polymer, or combinations thereof. For example, the conductive barrier layer is disposed between the insulating barrier layer and the conductive plug. The conductive barrier layer includes, for example, a metal compound such as tungsten nitride (WN), titanium nitride (TiN), or tantalum nitride (TaN). The barrier film may be formed by a PVD process or a CVD process.

The plurality of semiconductor chips 200 are laminated on the semiconductor chip 100. The plurality of semiconductor chips 100 and 200 face each other through front or rear surfaces. Each of the plurality of semiconductor chips 200 includes a second semiconductor substrate 201, a second front structure 210, and second front pads 230. Each of first to third semiconductor chips 200A, 200B, and 200C, but not an uppermost semiconductor chip 200D, of the plurality of semiconductor chips 200 includes a second rear surface passivation layer 220, second rear pads 240, and second through-electrodes 250 that are through silicon vias (TSVs). The plurality of semiconductor chips 200 are electrically connected to each other through a plurality of bumps 280 disposed below each of the plurality of semiconductor chips 200. Since the second semiconductor substrate 201 is similar to the first semiconductor substrate 101, a repeated description thereof will be omitted.

The second front structure 210 includes a device layer 211 and a front surface passivation layer 212. The device layer 211 includes a plurality of memory devices. For example, the device layer 211 may include volatile memory devices such as a DRAM or an SRAM, or non-volatile memory devices such as a PRAM, an MRAM, an FeRAM, or an RRAM. For example, in the semiconductor package 1000A of an embodiment, DRAM elements are disposed on device layers 211 of the plurality of semiconductor chips 200. Accordingly, the semiconductor package 1000A of an embodiment can be used for a High Bandwidth Memory (HBM) product or an Electro Data Processing (EDP) product. The device layer 211 includes interlayer insulating layers and multilayer wiring layers electrically connected to the memory devices in the device layer 211. The memory devices of the device layer 211 are electrically connected to the plurality of bumps 280 through the wiring layers. The front surface passivation layer 212 is disposed between the front pads 230 and the device layer 211 and between the insulating frame 270 and the device layer 211. The front surface passivation layer 212 includes at least one of silicon oxide, silicon nitride, or silicon oxynitride. The front surface passivation layer 212 includes a first region on which the front pads 230 are disposed and a second region that surrounds the first region, and the insulating frame 270 contacts the second region of the front surface passivation layer 212.

In an embodiment, the semiconductor chip 100 includes a plurality of logic elements and/or memory devices on the first front structure 110 and is referred to as a buffer chip or a control chip that depends on the function thereof, while each of the plurality of semiconductor chips 200 includes a plurality of memory devices on the second front structure 210 and may be referred to as a core chip. Alternatively, the semiconductor chip 100 may be referred to as a first semiconductor chip, and the semiconductor chip 200 may be referred to as a second semiconductor chip.

The plurality of semiconductor chips 200 include a first semiconductor chip 200A, a second semiconductor chip 200B, a third semiconductor chip 200C, and a fourth semiconductor chip 200D that are sequentially laminated on the semiconductor chip 100. The fourth semiconductor chip 200D has a thickness greater than thicknesses of the first to third semiconductor chips 200A, 200B, and 200C, but embodiments of the present inventive concept are not necessarily limited thereto. In addition, unlike the first to third semiconductor chips 200A. 200B, and 200C, the fourth semiconductor chip 200D does not include the rear pads 240 and the second through-electrodes 250. The number of chips included in the plurality of semiconductor chips 200 is not limited to that illustrated in the drawing and can vary according to embodiments.

The plurality of bumps 280 may be disposed on the front surface or the rear surface of one of the plurality of semiconductor chips 100 and 200. The plurality of bumps 280 are disposed between rear pads 240 of a lower semiconductor chip, such as the first semiconductor chip 200A, of the plurality of semiconductor chips 200, and front pads 230 of an upper semiconductor chip, such as the second semiconductor chip 200B, of the plurality of semiconductor chips 200. The plurality of bumps 280 are disposed between the first semiconductor chip 200A and the semiconductor chip 100. The plurality of bumps 280 electrically connect the plurality of semiconductor chips 200 and the semiconductor chip 100. In an embodiment, the plurality of bumps 280 include solder, but may include both pillars and solder in other embodiments. The pillar has a cylindrical column shape or a polygonal column shape such as a rectangular column shape or an octagonal column shape, and, for example, includes at least one of nickel (Ni), copper (Cu), palladium (Pd), platinum (Pt), gold (Au) or combinations thereof. The solder has a spherical or ball shape, and, for example, includes at least one of tin (Sn), indium (In), bismuth (Bi), antimony (Sb), copper (Cu), silver (Ag), zinc (Zn), lead (Pb) and/or alloys thereof. Examples of the alloy include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu— Bi, Sn—Cu—Zn, Sn—Bi—Zn, etc. The height of the plurality of bumps 280 is determined according to solder wetting in a reflow process.

The plurality of underfill layers 260 are disposed on the lower surfaces 200S of the plurality of semiconductor chips 200. The underfill layer 260 is disposed between the semiconductor chip 100 and the lowest first semiconductor chip 200A of the plurality of semiconductor chips 200 and between the plurality of semiconductor chips 200, and surrounds side surfaces of the plurality of bumps 280. The plurality of underfill layers 260 fix the plurality of semiconductor chips 200 to the semiconductor chip 100. The underfill layer 260 is disposed between the plurality of semiconductor chips 100 and 200 to contact and surround the plurality of bumps 280, and extends to a side surface of the semiconductor chip 200 adjacent to the lower surface 200S of the semiconductor chip 200, such as to a lower end of the side surface of the semiconductor chip 200. For example, the underfill layer 260 includes an underfill inner portion that vertically overlaps the semiconductor chip 200 and an underfill outer portion 260F that protrudes outwardly from the underfill inner portion. The underfill outer portion 260F protrudes out from an area that overlaps the semiconductor chip 200 and covers at least a portion of a side surface of the semiconductor chip 200. For example, the underfill outer portion 260F may be referred to as a fillet portion. The magnitude and shape of the protrusion of the underfill outer portion 260F can vary depending on process conditions, such as conditions of a thermal compression process. In an embodiment, the underfill layer 260 is a non-conductive film (NCF), but embodiments are not necessarily limited thereto. In some embodiments, the underfill layer 260 includes at least one of an epoxy resin, silica (SiO2), an acrylic copolymer, or combinations thereof.

The plurality of underfill layers 260 include a first underfill layer 260A between the semiconductor chip 100 and the first semiconductor chip 200A, a second underfill layer 260B between the first semiconductor chip 200A and the second semiconductor chip 200B, a third underfill layer 260C between the second semiconductor chip 200B and the third semiconductor chip 200C, and a fourth underfill layer 260D between the third semiconductor chip 200C and the fourth semiconductor chip 200D. At least portions of the underfill outer portions 260F of the first to fourth underfill layers 260A, 260B, 260C, and 260D have different lateral shapes. For example, the shape of the side surface of the first underfill layer 260A differs from the shape of the side surfaces of the second to fourth underfill layers 260B, 260C, and 260D. For example, the underfill outer portions 260F of the second and third underfill layers 260B and 260C protrude further than the underfill outer portion 260F of the fourth underfill layer 260D.

The plurality of insulating frames 270 are spaced apart from each other on the front or rear surface of one of the plurality of semiconductor chips 100 and 200. For example, the plurality of insulating frames 270 include at least four insulating frames 270_1, 270_2, 270_3 and 270_4 that overlap a plurality of corner regions of one of the plurality of semiconductor chips 100 and 200, and are spaced apart from each other in a direction, such as a vertical direction, in which the plurality of semiconductor chips 100 and 200 face each other.

The plurality of underfill layers 260 extend in a horizontal direction from a specific point, such as a center point, on the front or rear surface of one of the plurality of semiconductor chips 100 and 200. Since the space that overlaps the plurality of corner regions of one of the plurality of semiconductor chips 100 and 200 is farthest from the specific point, such as the center point, it is challenging to dispose the plurality of underfill layers 260 in this space. Since the plurality of insulating frames 270 are instead disposed in at least a portion of this space farthest from the specific point, expansion integrity of the plurality of underfill layers 260 on the front or rear surface of one of the plurality of semiconductor chips 100 and 200 is supplemented. Therefore, the reliability of the front or rear surface of one of the plurality of semiconductor chips 100 and 200 is increased, by, for example, preventing cracking or electrical shorts of the plurality of bumps 280, preventing warpage of the plurality of semiconductor chips, preventing detachment or delamination between a plurality of semiconductor chips, etc.

For example, each of at least four insulating frames 270_1, 270_2, 270_3, and 270_4 of the plurality of insulating frames 270 has one boundary line (270S in FIGS. 5 and 6) that has an oblique shape with respect to remaining boundary lines. Accordingly, even if the overall horizontal area of the plurality of insulating frames 270 is small, a longest distance that the plurality of underfill layers 260 extend from a specific point, such as a central point, on the front or rear surface of one of the plurality of semiconductor chips 100 and 200 can be effectively shortened. For example, the fact that the overall horizontal area of the plurality of insulating frames 270 is small means that the space in which the plurality of bumps 280 are disposed increases, and means that the degree of integration of the plurality of bumps 280 is efficiently increased. For example, the plurality of insulating frames 270 efficiently increase the reliability of the front surface or rear surface of one of the plurality of semiconductor chips 100 and 200 while efficiently increasing the degree of integration of the plurality of bumps 280.

For example, the remaining boundaries of each of the at least four insulating frames 270_1, 270_2, 270_3, and 270_4 of the plurality of insulating frames 270 are parallel to boundary lines of the plurality of corner regions of the plurality of semiconductor chips 200. For example, this structure may be formed by first forming the plurality of insulating frames 270 before stacking the plurality of semiconductor chips 100 and 200, and detachment or delamination between the plurality of semiconductor chips 100 and 200 can be effectively prevented.

For example, the underfill layers 260 contact at least four insulating frames 270_1, 270_2, 270_3, and 270_4 of the plurality of insulating frames 270. Accordingly, the possibility of an empty space occurring on the front or rear surface of one of the plurality of semiconductor chips 100 and 200 is effectively prevented, and thus, reliability of the front or rear surface of one of the plurality of semiconductor chips 100 and 200 can be further increased.

For example, the underfill layer 260 protrudes beyond spaces between adjacent insulating frames of at least four insulating frames 270_1, 270_2, 270_3, and 270_4, and the protruding portion of the underfill layer 260 does not overlap the plurality of semiconductor chips 200 in a direction in which the plurality of semiconductor chips 100 and 200 face each other, such as a vertical direction. The protruding portions of the underfill layer 260 are the underfill outer portions 260F. Accordingly, since the occurrence of an empty space on the front or rear surface of one of the plurality of semiconductor chips 100 and 200 can be effectively prevented, the reliability of the front surface or rear surface of one of the plurality of semiconductor chips 100 and 200 can be further increased.

The plurality of insulating frames 270 and the underfill layer 260 contain different insulating materials. For example, the plurality of insulating frames 270 contain a photosensitive organic material such as photosensitive polyimide (PSPI) or a photo imageable dielectric (PID) material, and thus, can be formed in a method, such as spin coating, jetting printing, or slit, that differs from a method of forming the underfill layer 260. Therefore, the plurality of insulating frames 270 effectively compensate for reliability limitations due to the formation method of the underfill layer 260.

The insulating frame 270 increases adhesion between the plurality of semiconductor chips 100 and 200 and the underfill layer 260. The terminal configuration of the plurality of semiconductor chips 200 is the front surface passivation layer 212, and the interface between the front surface passivation layer 212 and the underfill layer 260 is vulnerable to vapor pressure and thermal stress, so that interlayer delamination may occur. When the underfill layers 260 are reflowed through a thermal compression process, edge regions of the lower surfaces 200S of the semiconductor chips 200 are vulnerable to interlayer delamination. According to an embodiment of the present inventive concept, interface delamination between the semiconductor chip 200 and the underfill layer 260 is suppressed by locally disposing the insulating frame 270 in an area vulnerable to interlayer delamination. Therefore, the reliability of the semiconductor package is increased. In addition, the plurality of insulating frames 270 prevent the plurality of semiconductor chips 100 and 200 from being displaced when the plurality of semiconductor chips 100 and 200 are laminated on each other, or may supplement a thickness tolerance of the plurality of semiconductor chips 100 and 200.

The encapsulant 290 is disposed on the semiconductor chip 100 and covers a portion of the upper surface of the semiconductor chip 100 and side surfaces of the plurality of underfill layers 260. The encapsulant 290 covers a portion of the side surfaces of the plurality of semiconductor chips 200. As illustrated in FIG. 1A, the encapsulant 290 does not cover the upper surface of the fourth semiconductor chip 200D, and the upper surface of the fourth semiconductor chip 200D is exposed by the encapsulant 290. In an embodiment, the encapsulant 290 has a predetermined thickness and covers the upper surface of the fourth semiconductor chip 200D. The encapsulant 290 includes an insulating material, such as an epoxy molding compound (EMC).

Figure 2:
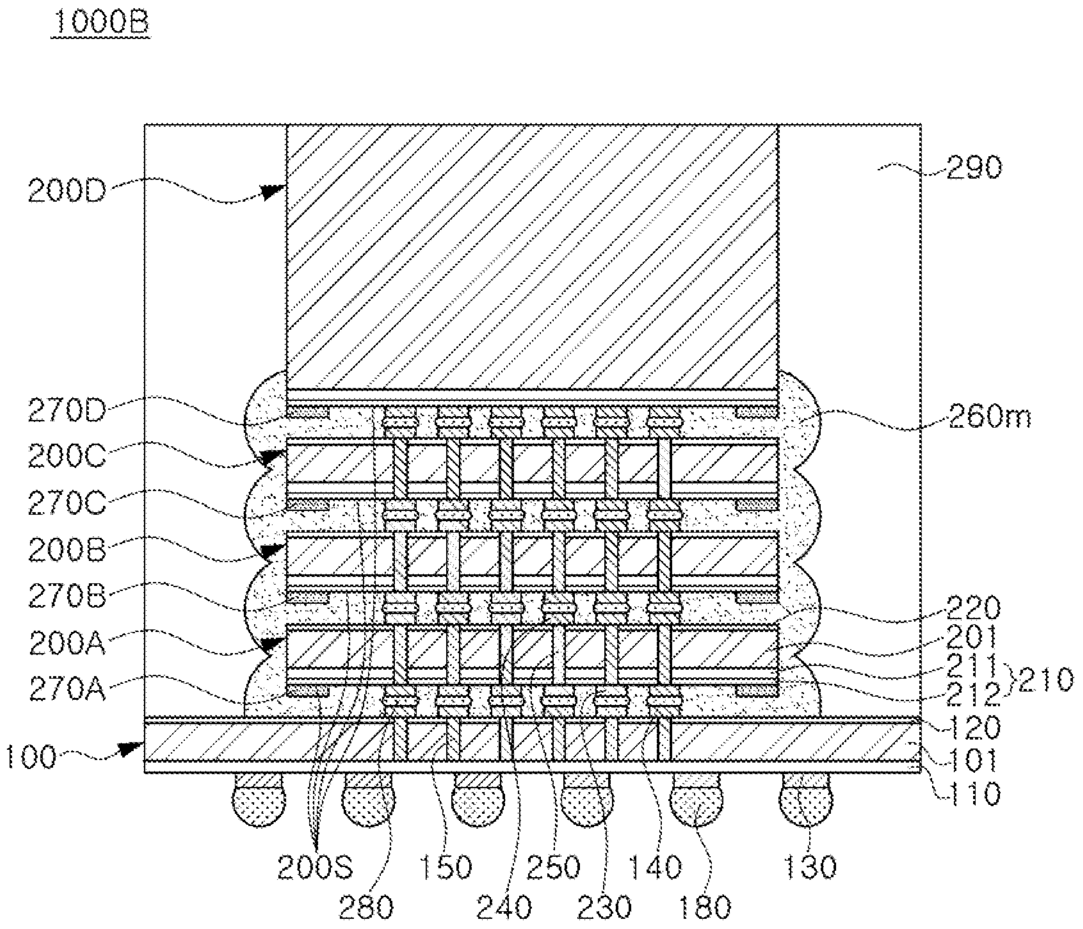
FIG. 2 is a cross-sectional view of a semiconductor package according to an embodiment.

FIG. 2 is a cross-sectional view illustrating a semiconductor package according to an embodiment.

Referring to FIG. 2, in an embodiment, in a semiconductor package 1000B according to an embodiment, the outer portions of the underfill protruding outward between the semiconductor chips 200 are combined to form one underfill layer 260*m*. An outer surface of the underfill layer 260*m* has a concave-convex shape, such as a wavy pattern.

FIGS. 3A to 3D are plan views of a semiconductor package according to an embodiment.

Figure 3A:
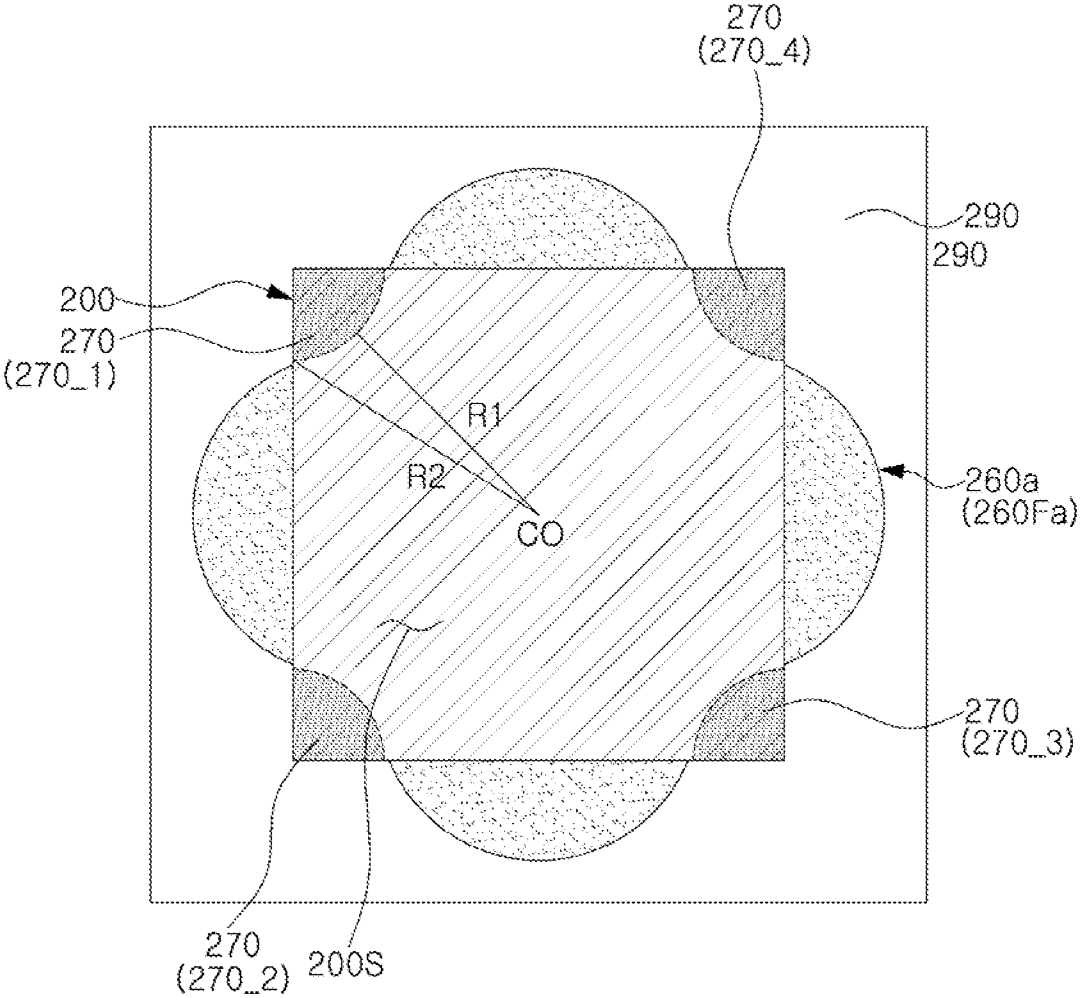
FIGS. 3A to 3D are plan views of a semiconductor package according to an embodiment.

Referring to FIG. 3A, in an embodiment, each of the at least four insulating frames 270_1, 270_2, 270_3, and 270_4 of the plurality of insulating frames 270 has a convex shape toward a central point (CO) of the front or rear surface of one of the plurality of semiconductor chips. The deviation of the distances R1 and R2, which is obtained by subtracting R1 from R2, that the underfill layer 260*a* extends from the center point CO to the plurality of insulating frames 270 varies depending on the shape of each of the at least four insulating frames and affects the shape of the underfill layer 260*a* and the protruding length of the outer portions 260Fa of the underfill layer. An optimum shape and an optimum protrusion length of the underfill layer 260*a* vary depending on the design of the semiconductor package.

Figure 3B:
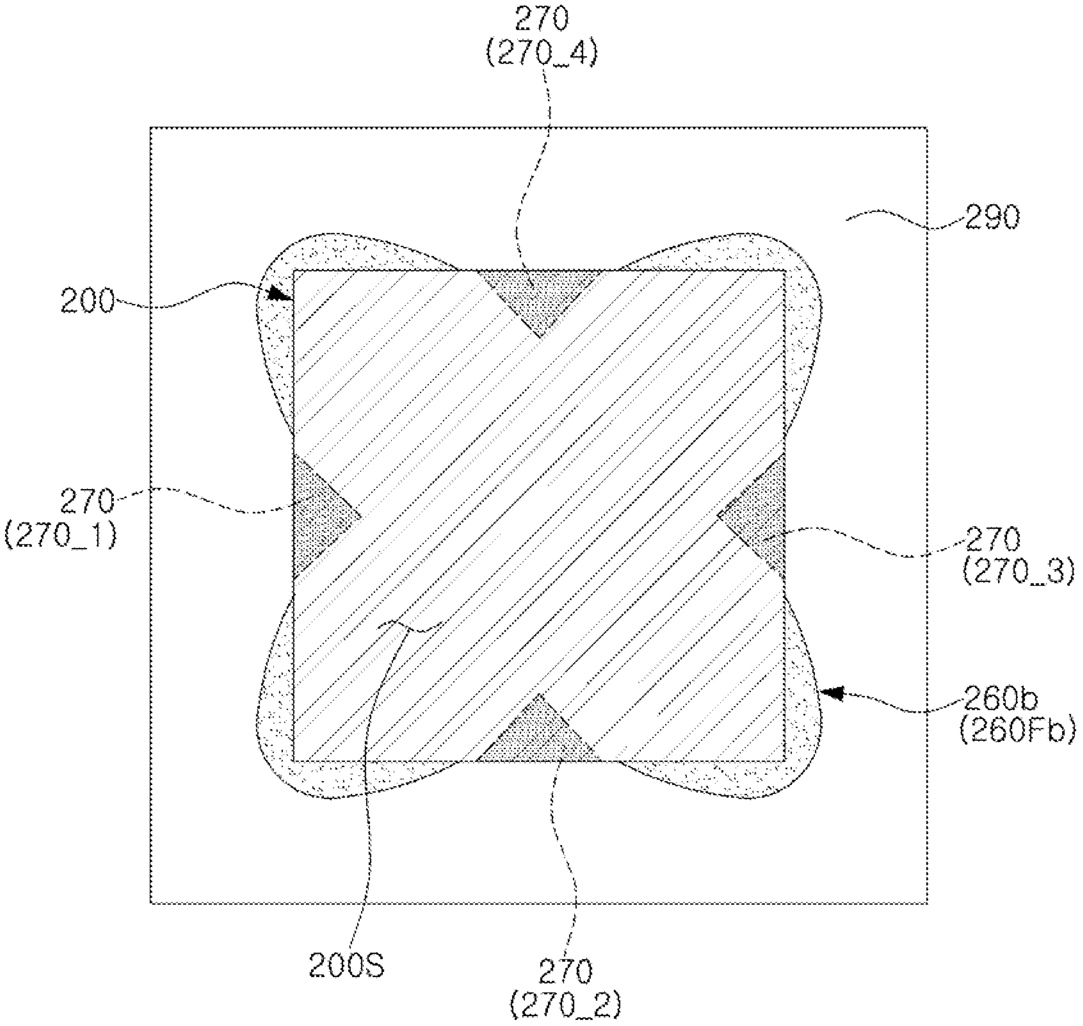

Referring to FIG. 3B, in an embodiment, respective positions of the at least four insulating frames 270_1, 270_2, 270_3, and 270_4 of the plurality of insulating frames 270 do not overlap corner portions of the lower surface 200S of the one of the plurality of semiconductor chips. The underfill layer 260*b* protrudes from corner portions of the lower surface 200S of the one of the plurality of semiconductor chips, and the underfill outer portions 260Fb are adjacent to the corner portions of the lower surface 200S of one of the plurality of semiconductor chips. In addition the at least four insulating frames 270_1, 270_2, 270_3, and 270_4 of the plurality of insulating frames 270 are disposed along sides of the lower surface 200S of the one of the plurality of semiconductor chips, and have a triangular shape that protrudes inward from each respective side of the lower surface 200S of the one of the plurality of semiconductor chips.

Figure 3C:
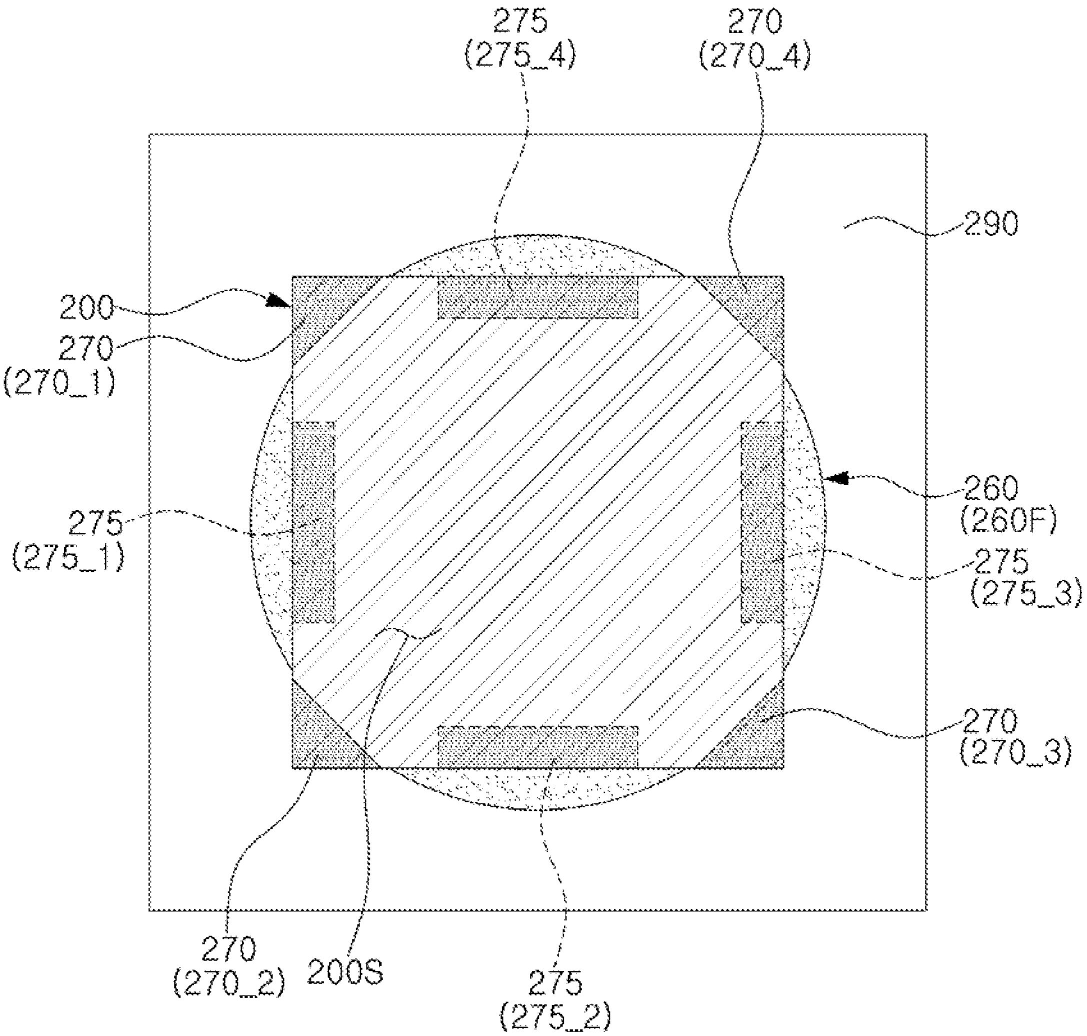

Referring to FIG. 3C, in an embodiment, the semiconductor package includes insulating frames 275 in addition to insulating frames 270. The number of the plurality of insulating frames 270 and 275 may exceed four, and there may be eight insulating frames 270_1, 270_2, 270_3, 270_4, 275_1, 275_2, 275_3, 275_4 spaced apart from each other. In addition, the boundary lines of some of the plurality of insulating frames 270 and 275 may be orthogonal to each other.

Figure 3D:
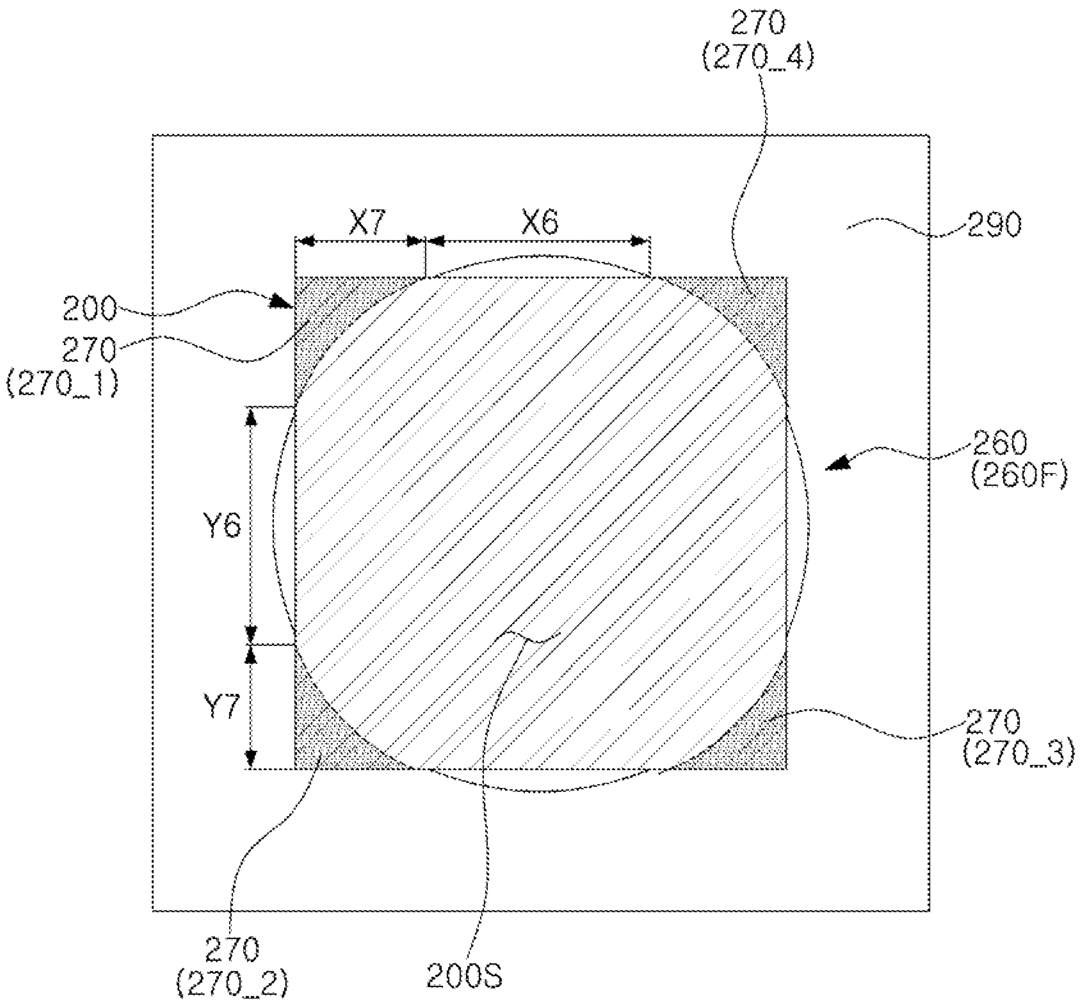

Referring to FIG. 3D, in an embodiment, each of the at least four insulating frames 270_1, 270_2, 270_3, and 270_4 of the plurality of insulating frames 270 has a concave shape that is curved toward a corner from a central point of the front or rear surface of one of the plurality of semiconductor chips. Maximum separation distances X6 and Y6 between adjacent insulating frames of the at least four insulating frames 270_1, 270_2, 270_3, and 270_4 are longer than maximum lengths X7 and Y7 of adjacent insulating frames of the at least four insulating frames 270_1, 270_2, 270_3, and 270_4, respectively.

FIGS. 4A to 4D are cross-sectional views of a semiconductor package according to an embodiment.

Figure 4A:
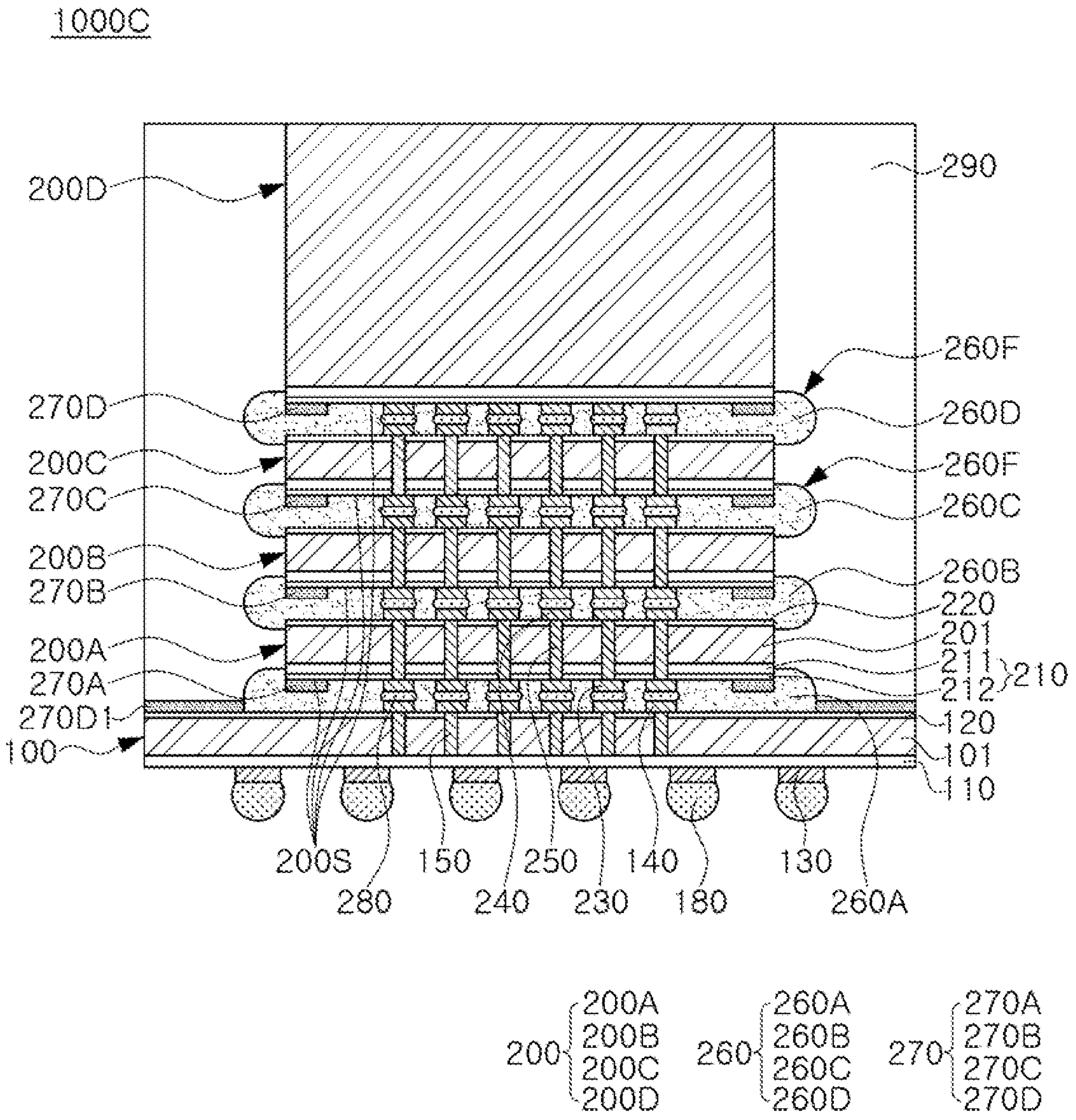
FIGS. 4A to 4D are cross-sectional views of a semiconductor package according to an embodiment.

Referring to FIG. 4A, in an embodiment, a semiconductor package 1000C according to an embodiment further includes a first lower insulating frame 270D1 that covers a portion of an upper surface of the semiconductor chip 100. The first lower insulating frame 270D1 contacts the front surface passivation layer 212 and contains a photosensitive polyimide (PSPI) material. The first lower insulating frame 270D1 contacts the first underfill layer 260A and surrounds the first underfill layer 260A. The first lower insulating frame 270D1 contacts an edge region of the upper surface of the semiconductor chip 100. The first lower insulating frame 270D1 increases adhesion between the semiconductor chip 100 and the encapsulant 290 and suppresses a delamination phenomenon that can occur at an interface between the semiconductor chip 100 and the encapsulant 290.

Figure 4B:
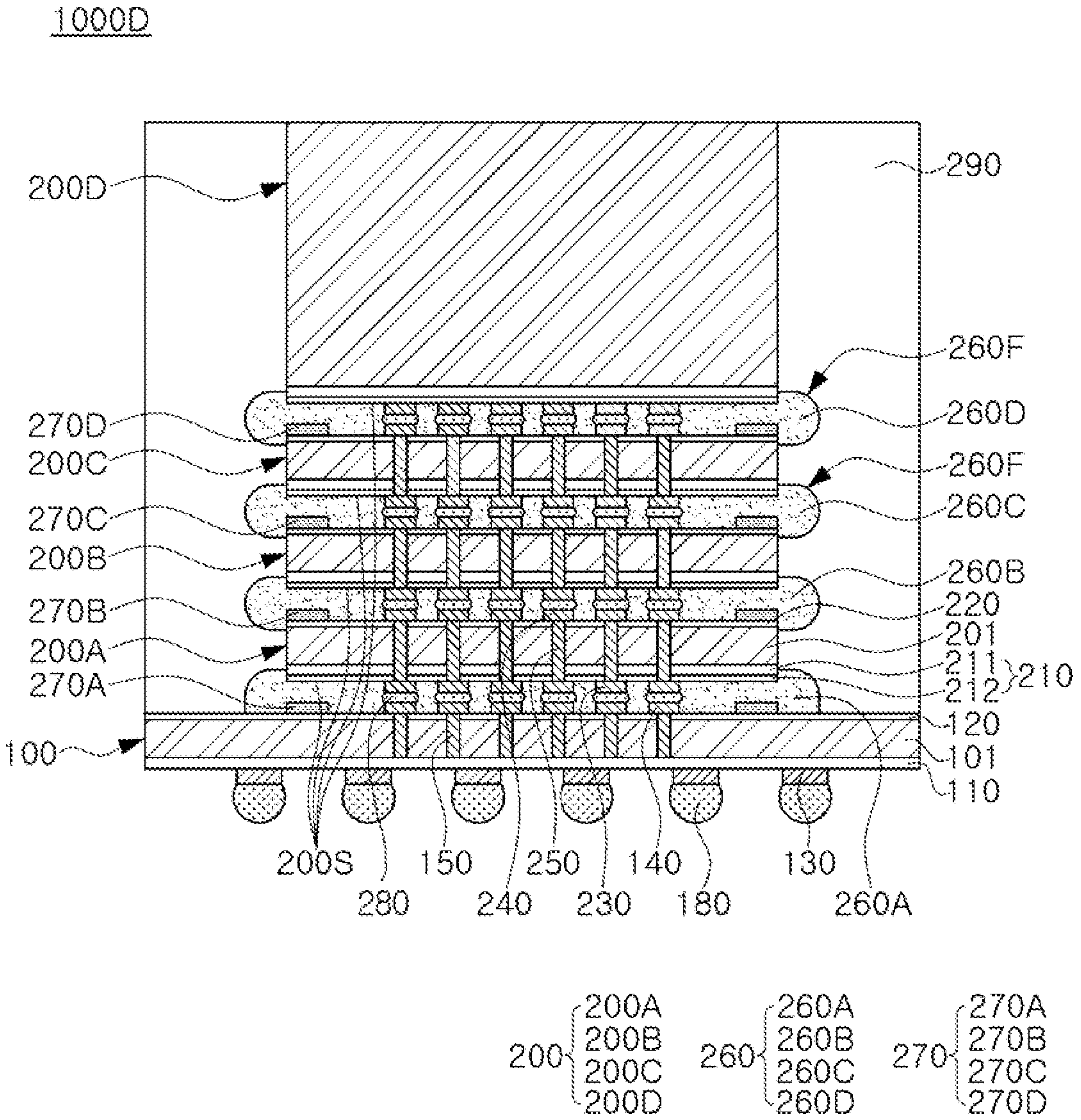

Referring to FIG. 4B, in an embodiment, in a semiconductor package 1000D according to an embodiment, a plurality of insulating frames 270 are disposed to contact edge regions of the upper surface of each semiconductor chip 200. The plurality of insulating frames 270 contact the rear surface passivation layer 220 and contain a photo imageable dielectric (PID) material. For example, the plurality of insulating frames 270 are disposed in contact with the upper surface of the semiconductor chip 100, and are disposed in contact with the edge region of respective upper surfaces of the first to third semiconductor chips 200A, 200B, and 200C of the plurality of semiconductor chips 200. The plurality of insulating frames 270 increase adhesion between the plurality of semiconductor chips 200 and the plurality of underfill layers 260, and suppress interfacial delamination, thereby increasing reliability of the semiconductor package 1000D.

Referring to FIGS. 1, 2, 4A and 4B, in some embodiments, the plurality of insulating frames 270 are spaced apart from one of the plurality of semiconductor chips 100 and 200, and a portion of the underfill layer 260 overlaps the plurality of insulating frames 270 in a direction, such as a vertical direction, in which the plurality of semiconductor chips 100 and 200 face each other. Accordingly, the reaction force of the plurality of insulating frames 270 toward the underfill layer 260 is reduced, and thus, a tendency for the underfill layer 260 to extend toward the plurality of corner portions of the plurality of semiconductor chips 100 and 200 is not substantially affected by the plurality of insulating frames 270. For example, since the overall arrangement efficiency of the plurality of insulating frames 270 and the underfill layer 260 is further increased, the reliability of the front or rear surface of one of the plurality of semiconductor chips 100 and 200 is more efficiently increased.

Figure 4C:
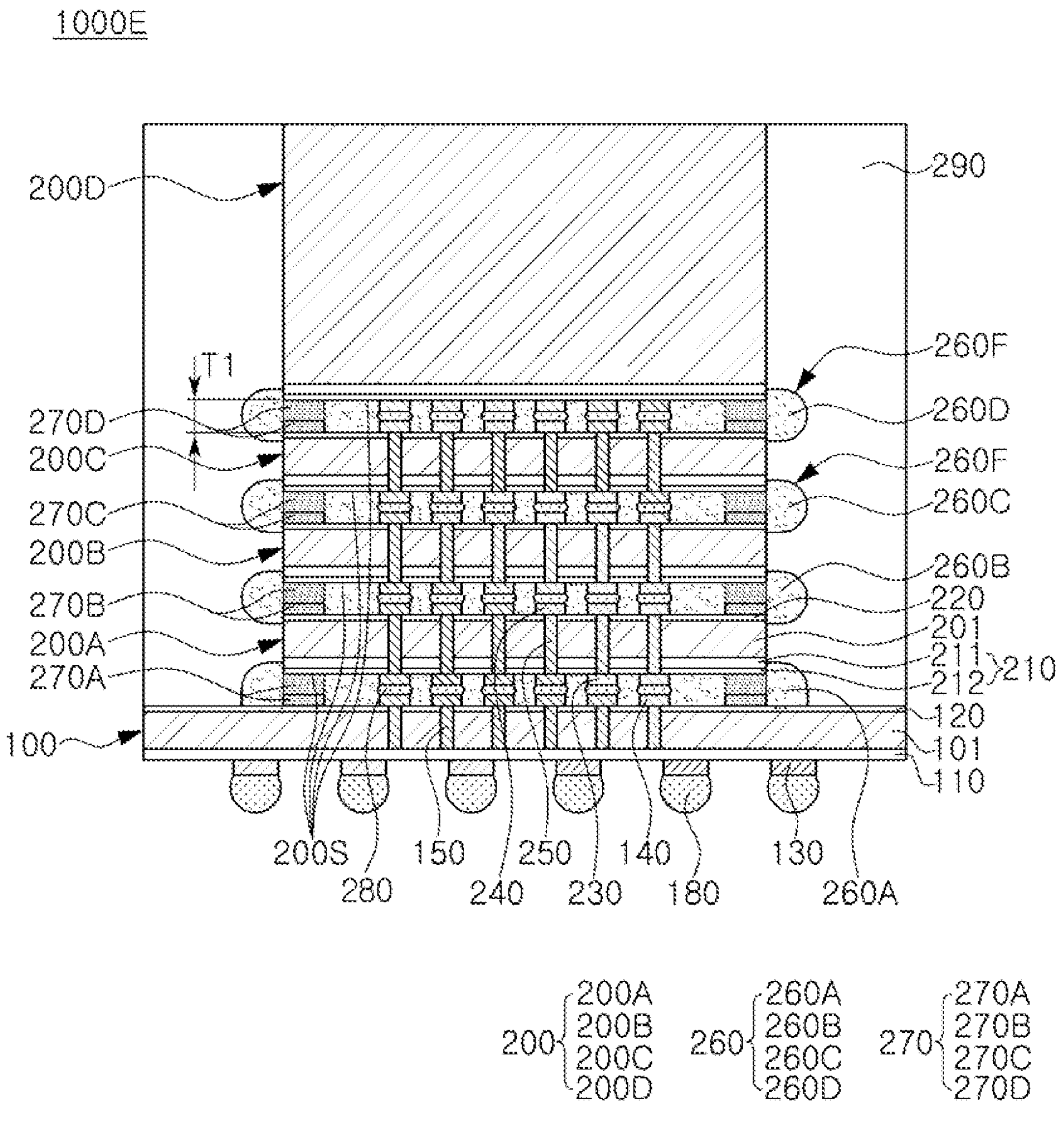

Depending on the design, referring to FIG. 4C, in an embodiment, the plurality of insulating frames 270 contact all of the plurality of semiconductor chips 100 and 200 to support the plurality of semiconductor chips 100 and 200 in a vertical direction. Accordingly, reliability of the plurality of bumps 280, such as anti-breakability and electrical short protection, is further increased. The thickness T1 of each of the plurality of insulating frames 270 may be greater than 1 μm and less than 10 μm, or may be 2 μm or more and 5 μm or less.

Figure 4D:
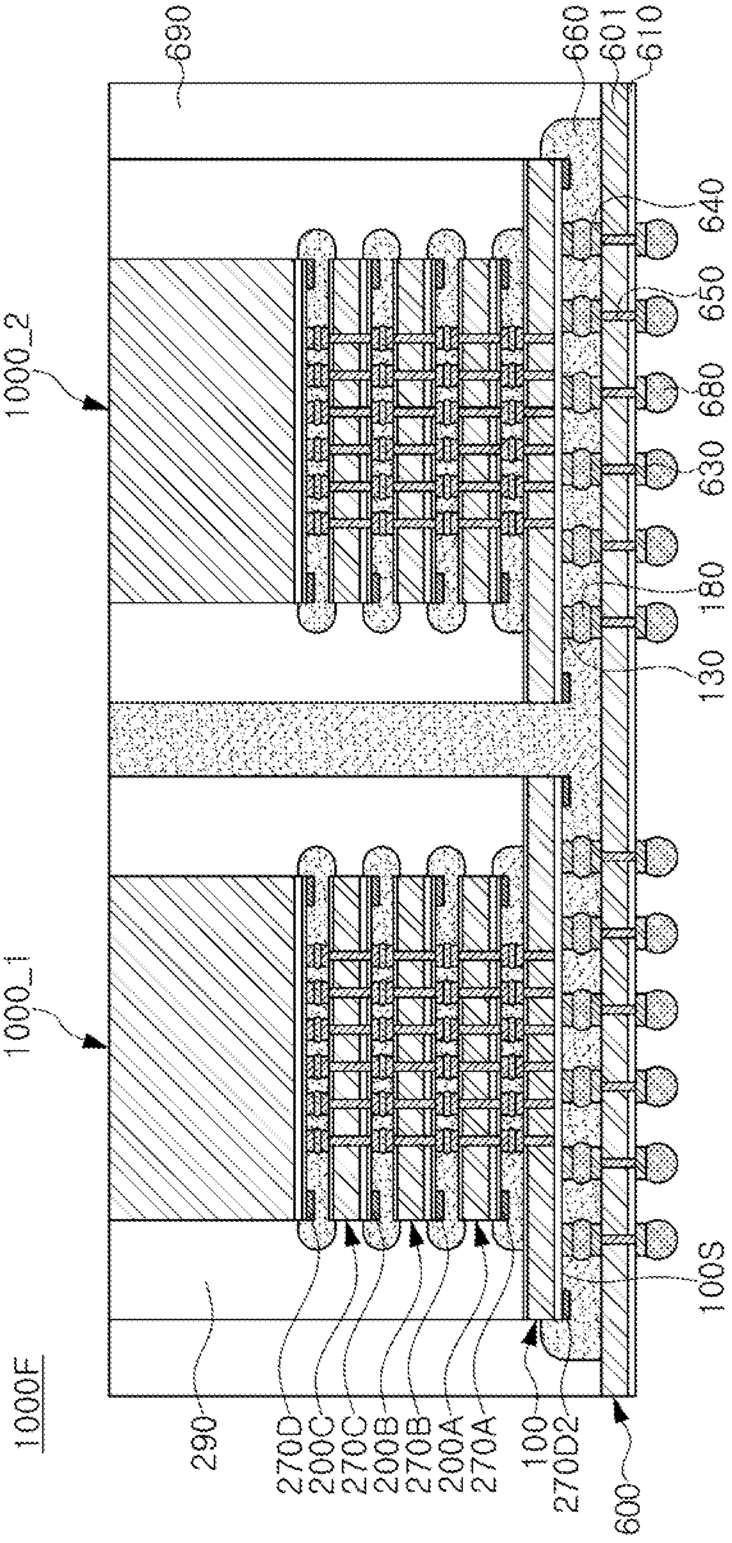

Referring to FIG. 4D, a semiconductor package 1000F according to an embodiment further includes an interposer substrate 600, an interposer underfill layer 660, a second lower insulating frame 270D2 that contacts the edge region of the lower surface 100S of the semiconductor chip 100, and an interposer encapsulant 690. At least two of the semiconductor package 1000A illustrated in FIG. 1A may be disposed two side by side on the interposer substrate 600, which will be referred to as a first chip structure 1000_1 and a second chip structure 1000_2 below, respectively.

The interposer substrate 600 includes a semiconductor substrate 601, a lower protective layer 610, a lower pad 630, an upper pad 640, an interposer bump 680, and an interposer through-electrode 650. The interposer substrate 600 can be disposed on a package substrate disposed below the interposer substrate 600. The package substrate may be a substrate for a semiconductor package that includes a printed circuit board (PCB), a ceramic substrate, a glass substrate, a tape wiring board, etc. In an embodiment, the interposer substrate 600 includes a multilayer wiring layer electrically connected to the interposer through-electrodes 650.

The semiconductor substrate 601 includes, for example, silicon (Si). Accordingly, the interposer substrate 600 may be referred to as a silicon interposer.

The lower protective layer 610 is disposed on a lower surface of the semiconductor substrate 601, and the lower pad 630 are disposed on the lower protective layer 610. The lower pad 630 is connected to the through-electrode 650. The chip structures 1000_1 and 1000_2 are electrically connected to the package substrate through the interposer bumps 680 disposed on the lower pads 630.

The interposer through-electrode 650 penetrates the semiconductor substrate 601 by extending from the upper surface to the lower surface of the substrate 601. Depending on an embodiment, the interposer substrate 600 may include only a wiring layer therein and might not include an interposer through-electrode.

The interposer bump 680 is disposed on the lower surface of the interposer substrate 600 and is electrically connected to wiring layers inside the interposer substrate 600.

The interposer underfill layer 660 extends between the chip structures 1000_1 and 1000_2 and surrounds the lower bumps 180 between the chip structures 1000_1 and 1000_2 and the interposer substrate 600. The interposer underfill layer 660 surrounds the second lower insulating frame 270D2 and covers at least a portion of a side surface of the semiconductor chip 100 of each of the chip structures 1000_1 and 1000_2.

The second lower insulating frame 270D2 contacts an edge region of the lower surface 100S of the semiconductor chip 100. The second lower insulating frame 270D2 increases adhesion between the semiconductor chip 100 and the interposer underfill layer 660, and suppresses interfacial delamination, thereby increasing reliability of the semiconductor package 1000F.

The interposer encapsulant 690 is disposed on the interposer substrate 600 and covers the interposer underfill layer 660 and the chip structures 1000_1 and 1000_2. The interposer encapsulant 690 includes an insulating material, such as an epoxy molding compound (EMC).

Figure 5:
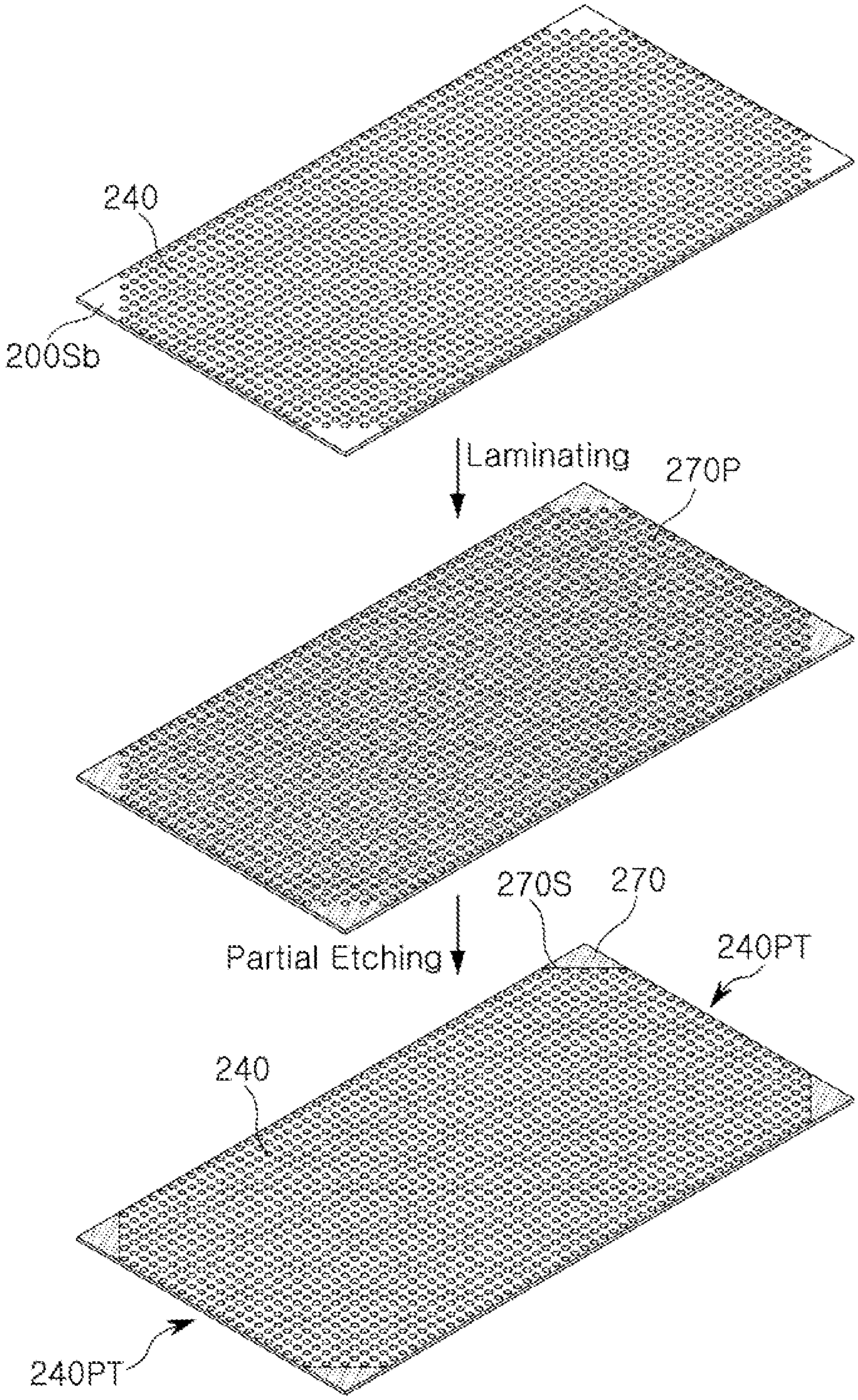
FIG. 5 illustrates a process of forming a plurality of insulating frames on a rear surface of a semiconductor chip of a semiconductor package according to an embodiment.
Figure 6:
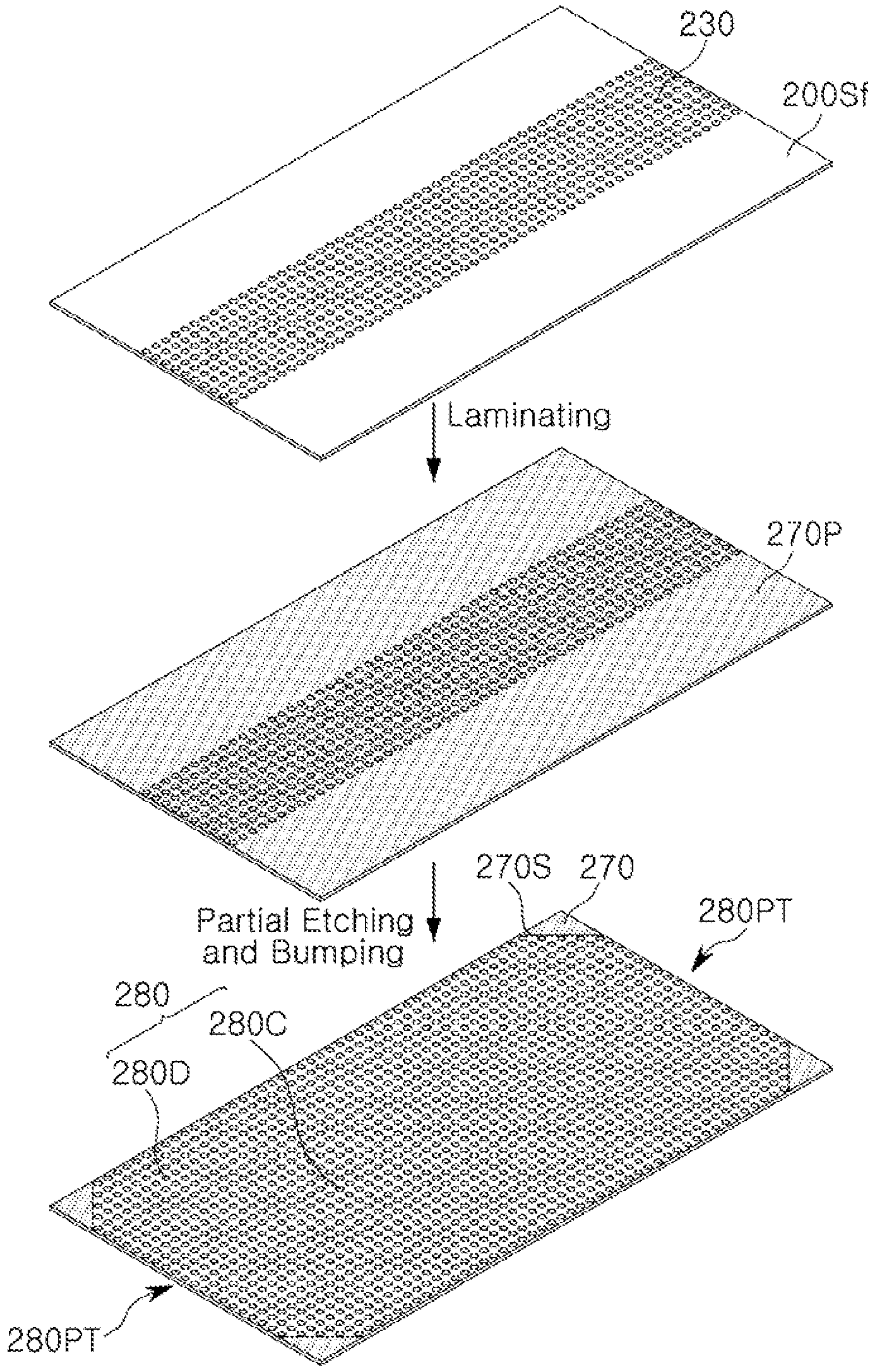
FIG. 6 illustrates a process of forming a plurality of insulating frames on a front surface of a semiconductor chip of a semiconductor package according to an embodiment.

FIG. 5 is a perspective view that illustrates a process of forming a plurality of insulating frames on the rear surface of a semiconductor chip of a semiconductor package according to an embodiment, and FIG. 6 is a perspective view that illustrates a process of forming a plurality of insulating frames on the front side of the semiconductor chip of a semiconductor package according to an embodiment.

Referring to FIG. 5, in an embodiment, rear pads 240 are disposed on rear surfaces 200Sb of the plurality of semiconductor chips, insulating layers 270P are stacked on the rear surfaces 200Sb of the plurality of semiconductor chips, and the plurality of insulating frames 270 are formed by partially etching the insulating layers 270P. Since the rear pads 240 fill an area in which the plurality of insulating frames 270 are not disposed, the arrangement of the rear pads 240 has a form that protrudes toward the space between the plurality of insulating frames 270, and thus form a protruding portion 240PT. In each of the plurality of insulating frames 270, one boundary line 270S has an oblique direction with respect to the remaining boundary lines, and edge portions of the rear pads 240 are arranged side by side along one boundary line 270S of each of the plurality of insulating frames 270.

Referring to FIG. 6, in an embodiment, front pads 230 are disposed on the front surfaces 200Sf of the plurality of semiconductor chips, and insulating layers 270P are stacked on the front surfaces 200Sf of the plurality of semiconductor chips. The plurality of insulating frames 270 are formed by partially etching the insulating layers 270P, and the plurality of bumps 280 are formed to fill regions where the plurality of insulating frames 270 are not disposed. Accordingly, since the arrangement of the plurality of bumps 280 has a form that protrudes toward the space between the plurality of insulating frames 270, the protrusion 280PT is formed. Accordingly, even if the overall horizontal area of the plurality of insulating frames 270 is small, a longest distance that the plurality of underfill layers can extend from a specific point, such as a central point, on the front or rear surface of one of the plurality of semiconductor chips is effectively shortened. For example, the fact that the overall horizontal area of the plurality of insulating frames 270 is small means that the space in which the plurality of bumps 280 are disposed increases and that the integration degree of the plurality of bumps 280 is effectively increased. For example, the plurality of insulating frames 270 efficiently increase the reliability of the front or rear surface of one of the plurality of semiconductor chips while efficiently increasing the degree of integration of the plurality of bumps 280.

For example, each of the plurality of insulating frames 270 has a shape in which one boundary line 270S is oblique with respect to the remaining boundary lines, and edge portions of the plurality of bumps 280 are arranged side by side along one boundary 270S of each of the plurality of insulating frames 270. The plurality of bumps 280 include connection bumps 280C connected to the front pads 230 and dummy bumps 280D not connected to the front pads 230. The dummy bumps 280D assist the arrangement of the plurality of bumps 280 to correspond to the shape of the plurality of insulating frames 270.

Figure 7A:
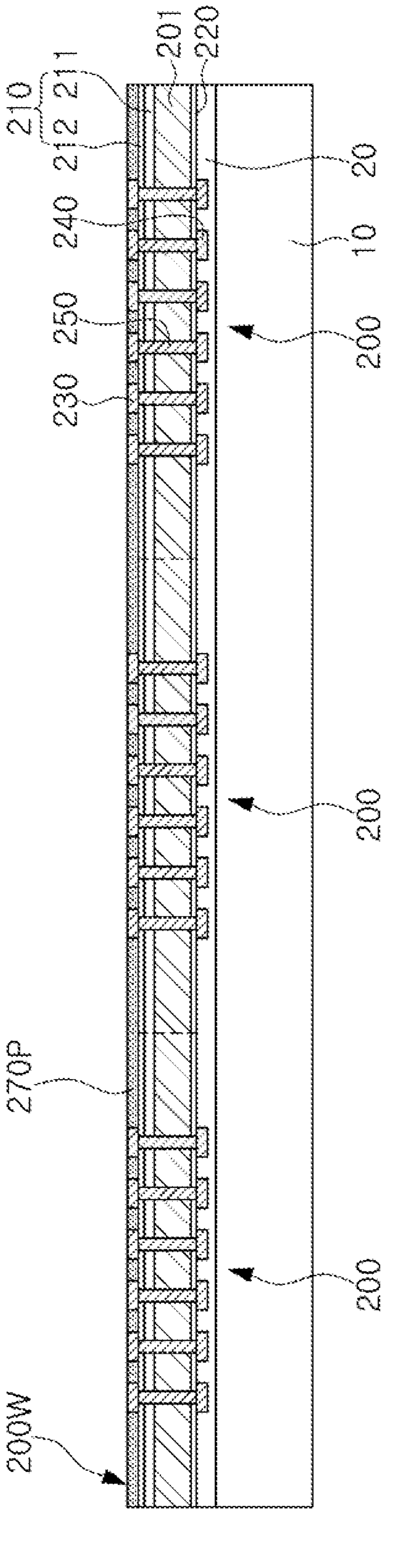
FIGS. 7A to 7C illustrate a process of manufacturing semiconductor chips according to an embodiment.
Figure 7B:
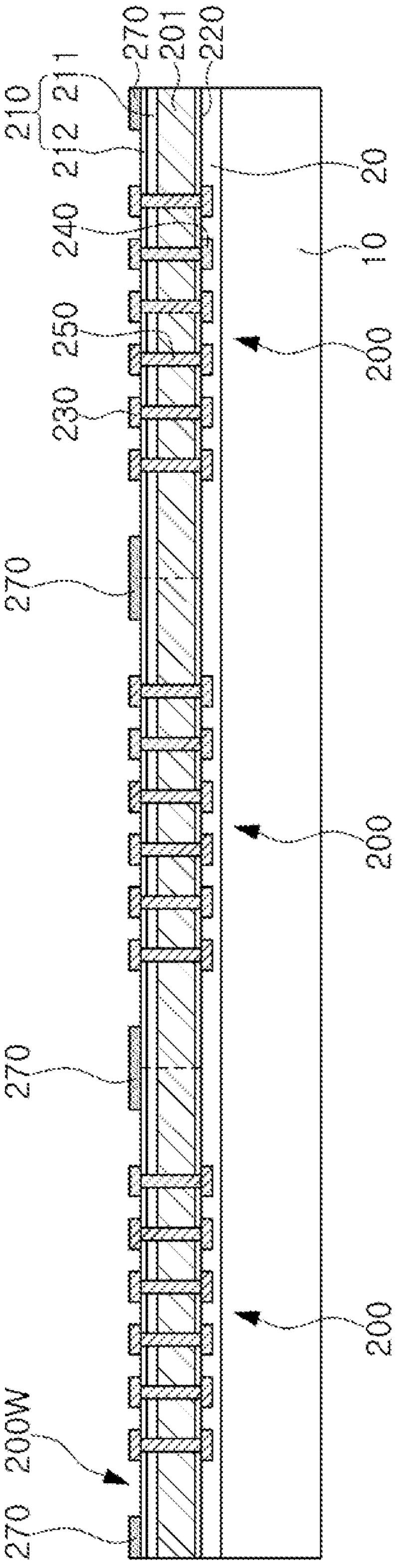
Figure 7C:
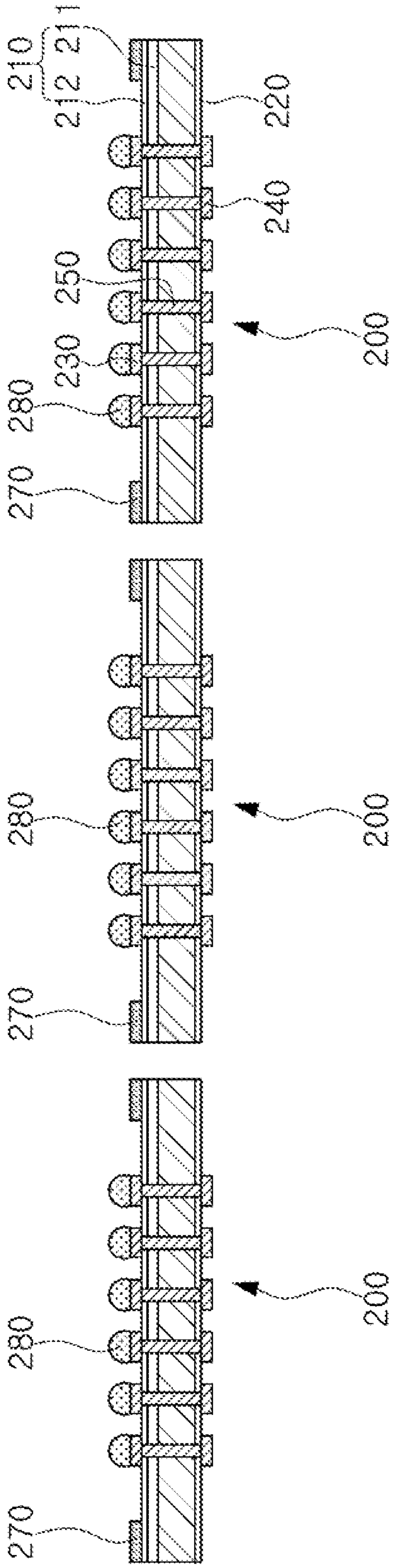

FIGS. 7A to 7C are cross-sectional views that illustrate a process of manufacturing semiconductor chips according to an embodiment.

Referring to FIG. 7A, in an embodiment, a semiconductor wafer 200W for semiconductor chips 200 that include through-electrodes 250 is attached to a carrier 10 using an adhesive material layer 20. Components for the semiconductor chips 200 are implemented in the semiconductor wafer 200W. The semiconductor chips 200 are defined by scribe lanes, illustrated as thick dotted lines, in the semiconductor wafer 200W. The semiconductor wafer 200W is attached to the carrier 10 so that the lower surfaces of the semiconductor chips 200 on which the rear pads 240 are disposed face the adhesive material layer 20. The rear pads 240 are surrounded by the adhesive material layer 20, and the lower surface of the semiconductor wafer 200W contacts the upper surface of the adhesive material layer 20. An insulating frame 270P is formed on the semiconductor wafer 200W. The insulating frame 270P may be formed, for example, by spin coating.

Referring to FIG. 7B, in an embodiment, a patterned insulating frame 270 is formed by removing a portion of the insulating frame 270P by a photolithography process and an etching process. When the insulating frame 270 includes photosensitive polyimide (PSPI), precise patterning may be possible. The insulating frame 270 remains on the edge region of the surface of each semiconductor chip 200 through the photolithography process and the etching process.

Referring to FIG. 7C, in an embodiment, the semiconductor wafer 200W is cut along the scribe line and separated into a plurality of semiconductor chips 200. Bumps 280 are formed on the plurality of semiconductor chips 200. The adhesive material layer 20 and the carrier 10 are removed.

FIGS. 8A to 8D are cross-sectional views that illustrate a manufacturing process of a semiconductor package according to an embodiment.

Figure 8A:
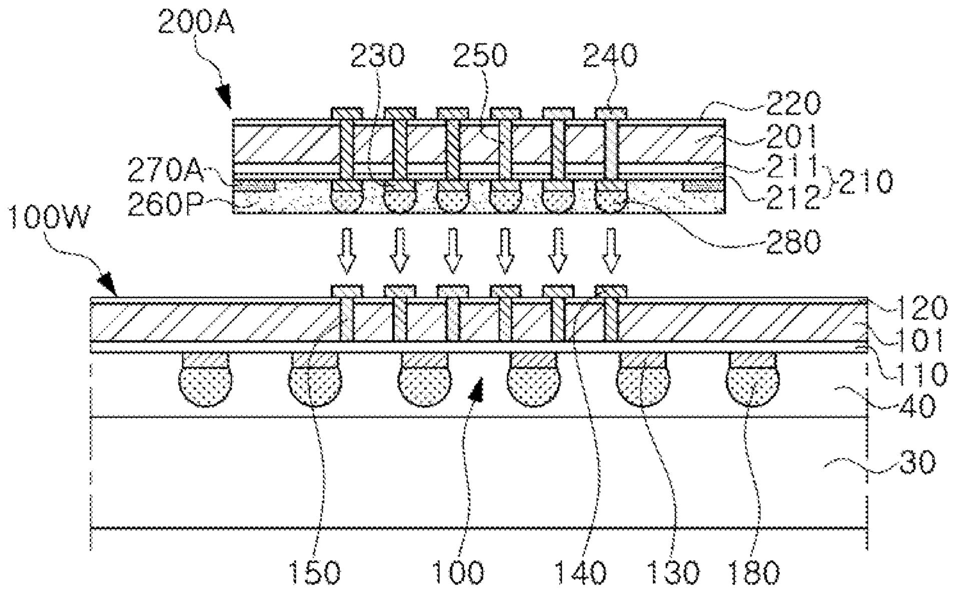
FIGS. 8A to 8D illustrate a process of manufacturing a semiconductor package according to an embodiment.

Referring to FIG. 8A, in an embodiment, a semiconductor wafer 100W for the semiconductor chip 100 is prepared, and the first semiconductor chip 200A fabricated in FIGS. 7A to 7C is attached to the semiconductor wafer 100W. Components for the semiconductor chip 100 are implemented in the semiconductor wafer 100W. The semiconductor wafer 100W is attached to a carrier 30 using an adhesive material layer 40. The bumps 280 of the first semiconductor chip 200A are attached to the semiconductor wafer 100W while being aligned with the first rear pads 140 of the semiconductor chip 100. The first semiconductor chip 200A that is attached to the semiconductor wafer 100W includes an adhesive film 260P that covers the plurality of bumps 280 and the insulating frames 270A formed on the lower surface of the first semiconductor chip 200A.

Figure 8B:
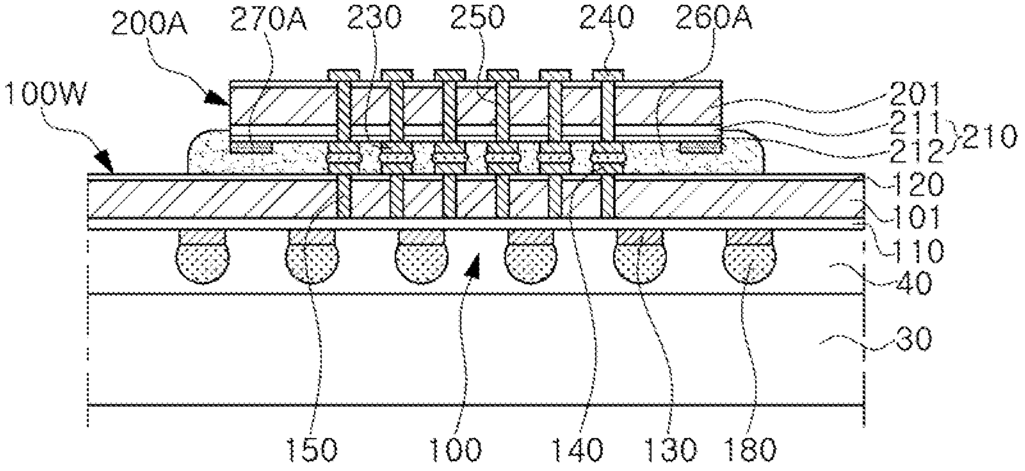

Referring to FIG. 8B, in an embodiment, a thermal compression (TC) or similar process is performed on the first semiconductor chip 200A to which the adhesive film 260P is attached, thereby bonding the first semiconductor chip 200A to the semiconductor wafer 100W of the semiconductor chip 100. While the thermal compression process is being performed, the adhesive film 260P is reflowed and cured to form the first underfill layer 260A. For example, an underfill outer portion is formed that protrudes outward from a portion interposed between the semiconductor chip 100 and the first semiconductor chip 200A.

Figure 8C:
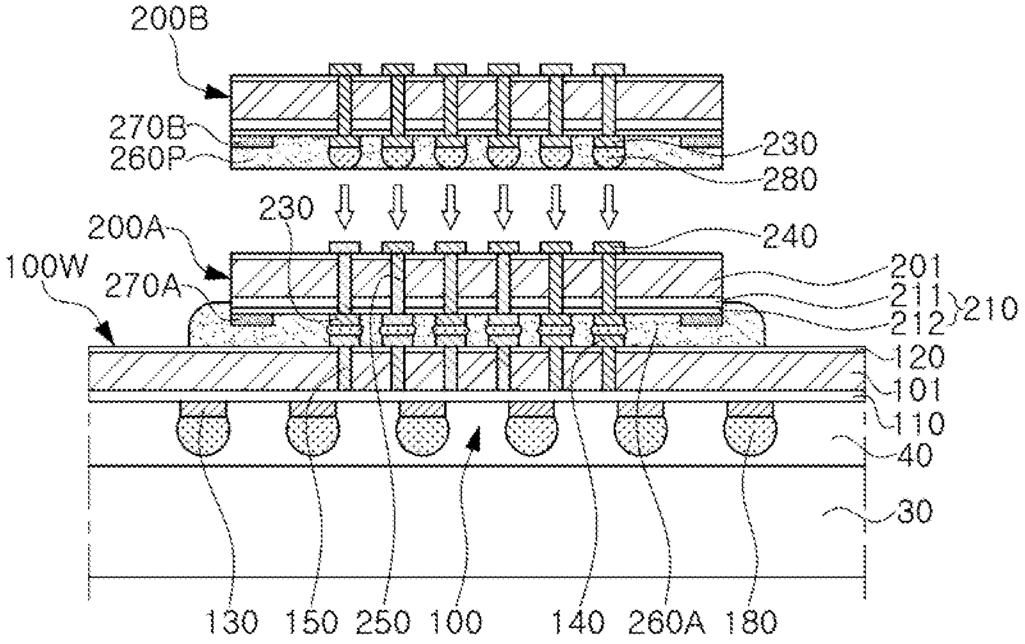

Referring to FIG. 8C, in an embodiment the second semiconductor chip 200B is attached on the first semiconductor chip 200A. The bumps 280 of the second semiconductor chip 200B are attached to the first semiconductor chip 200A while being aligned with the second rear pads 240 of the first semiconductor chip 200A. The second semiconductor chip 200B that is attached to the first semiconductor chip 200A includes the adhesive film 260P that covers the plurality of bumps 280 and the insulating frames 270B formed on the lower surface of the second semiconductor chip 200B.

Figure 8D:
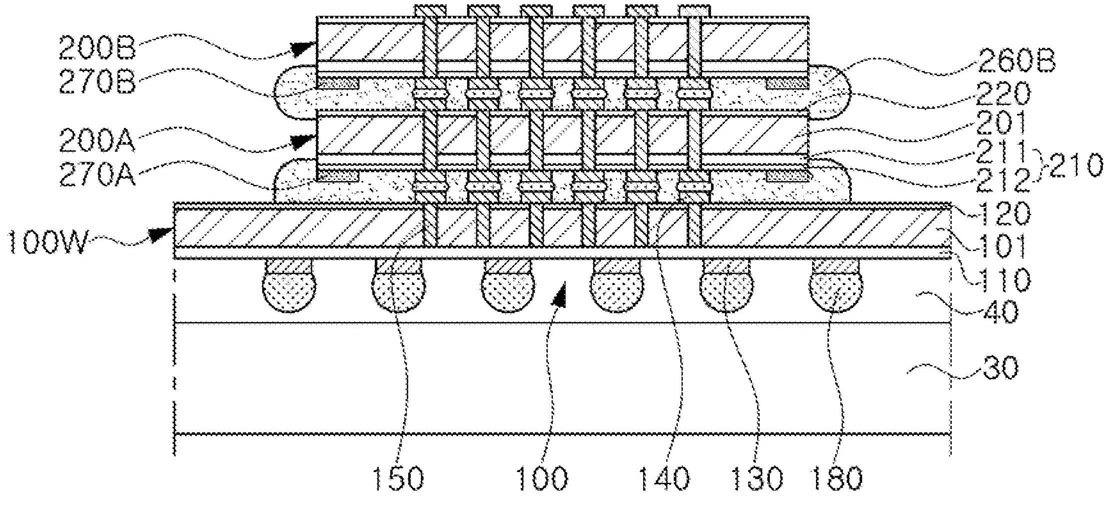

Referring to FIG. 8D, in an embodiment, the second semiconductor chip 200B is bonded to the first semiconductor chip 200A by performing a thermal compression (TC) or similar process on the second semiconductor chip 200B to which the adhesive film 260P is attached. While the thermal compression process is being performed, the adhesive film 260P is reflowed and cured to form the second underfill layer 260B. For example, an underfill outer portion is formed that protrudes outward from a portion interposed between the first semiconductor chip 200A and the second semiconductor chip 200B.

The processes of FIGS. 8C and 8D are repeatedly performed to form a third semiconductor chip 200C, a fourth semiconductor chip 200D, a third underfill layer 260C, and a fourth underfill layer 260D, and to form an encapsulant 290, and after performing a polishing process, the semiconductor wafer 100W is cut along the scribe line to separate into a plurality of base chips 100, and thus, a semiconductor package 1000A is manufactured that includes the semiconductor chip 100 and the semiconductor chips 200 laminated on the semiconductor chip 100.

As set forth above, in a semiconductor package according to an embodiment, reliability of a front or rear surface of one of a plurality of semiconductor chips is increased by, for example, preventing cracking or electrical shorts of multiple bumps, preventing warpage of multiple semiconductor chips, preventing detachment between multiple semiconductor chips, etc.

Alternatively, in a semiconductor package according to an embodiment, when a plurality of semiconductor chips are laminated together, displacement of the plurality of semiconductor chips can be prevented, a thickness tolerance of the plurality of semiconductor chips can be compensated, or reliability of the plurality of bumps can be increased.

Alternatively, in a semiconductor package according to an embodiment, reliability of the front or rear surface of one of the plurality of semiconductor chips and the degree of integration of the plurality of bumps can be increased together.

While embodiments have been illustrated and described above, it will be apparent to those skilled in the art that modifications and variations can be made without departing from the scope of embodiments of the present inventive concept as defined by the appended claims.

What is claimed is:

1. A semiconductor package, comprising:

a plurality of semiconductor chips that face each other;

a plurality of bumps disposed on a front surface or a rear surface of one of the plurality of semiconductor chips;

an underfill layer that surrounds the plurality of bumps; and a plurality of insulating frames spaced apart from each other on the front or rear surface of the one of the plurality of semiconductor chips and also spaced apart from each of the plurality of bumps, wherein the plurality of insulating frames respectively overlap a plurality of corner regions of the one of the plurality of semiconductor chips in a direction in which the plurality of semiconductor chips face each other, and the plurality of insulating frames and the underfill layer comprise different insulating materials.

2. The semiconductor package of claim 1, wherein one of the plurality of insulating frames includes a plurality of boundary lines, and one boundary line among the plurality of boundary lines has an oblique direction with respect to remaining boundary lines among the plurality of boundary lines.

3. The semiconductor package of claim 2, wherein the remaining boundary lines of the plurality of boundary lines are respectively parallel to boundary lines of one of the plurality of corner regions, on which the one of the plurality of insulating frames is disposed.

4. The semiconductor package of claim 1, wherein the underfill layer contacts each of the plurality of insulating frames.

5. The semiconductor package of claim 4, wherein the underfill layer protrudes beyond spaces between adjacent insulating frames of the plurality of insulating frames, and a protruding portion of the underfill layer does not overlap the one of the plurality of semiconductor chips in a direction in which the plurality of semiconductor chips face each other.

6. The semiconductor package of claim 1, wherein a maximum separation distance between adjacent insulating frames of the plurality of insulating frames is longer than a maximum length, in the same direction as a direction of the maximum separation distance, of each of adjacent insulating frames of the plurality of insulating frames.

7. The semiconductor package of claim 1, wherein a thickness of each of the plurality of insulating frames is greater than 1 μm and less than 10 μm.

8. The semiconductor package of claim 1, wherein the plurality of insulating frames are spaced apart from another one of the plurality of semiconductor chips.

9. The semiconductor package of claim 8, wherein a portion of the underfill layer overlaps the plurality of insulating frames in a direction in which the plurality of semiconductor chips face each other.

10. The semiconductor package of claim 1, wherein each of the plurality of semiconductor chips includes, a semiconductor substrate;

a device layer disposed below the semiconductor substrate;

a front surface passivation layer disposed below the device layer and that provides a front surface; and front pads disposed below the front surface passivation layer, wherein the plurality of insulating frames are in contact with the front surface passivation layer and contain a photosensitive polyimide (PSPI).

11. The semiconductor package of claim 1, wherein each of the plurality of semiconductor chips includes, a semiconductor substrate that includes through-electrodes;

a device layer disposed below the semiconductor substrate;

a rear surface passivation layer disposed on the semiconductor substrate and that provides a rear surface; and rear pads connected to the through-electrodes and disposed on the rear surface passivation layer, wherein the plurality of insulating frames contact the rear surface passivation layer and contain a photo imageable dielectric (PID) material.

12. The semiconductor package of claim 1, wherein surfaces of the plurality of semiconductor chips that face each other have different sizes.

13. The semiconductor package of claim 1, wherein the plurality of bumps are disposed in a space between the plurality of insulating frames.

14. A semiconductor package, comprising:

a plurality of semiconductor chips that face each other;

a plurality of bumps disposed on a front surface or a rear surface of one of the plurality of semiconductor chips;

an underfill layer that surrounds the plurality of bumps; and a plurality of insulating frames spaced apart from each other on the front or rear surface of the one of the plurality of semiconductor chips and also spaced apart from each of the plurality of bumps, wherein the plurality of bumps are disposed in a space between the plurality of insulating frames, and the plurality of insulating frames and the underfill layer comprise different insulating materials.

15. The semiconductor package of claim 14, wherein one of the plurality of insulating frames has a plurality of boundary lines, and one boundary line among the plurality of boundary lines is oblique with respect to remaining boundary lines among the plurality of boundary lines, and edge portions of two or more of the plurality of bumps are arranged side by side along the one boundary line.

16. The semiconductor package of claim 14, wherein each of the plurality of semiconductor chips includes:

a semiconductor substrate;

a device layer disposed below the semiconductor substrate;

a front surface passivation layer disposed below the device layer and that provides a front surface; and front pads disposed below the front surface passivation layer, wherein portions of the plurality of bumps are dummy bumps not connected to the front pads.

17. The semiconductor package of claim 14, wherein each of the plurality of semiconductor chips includes:

a semiconductor substrate that includes through-electrodes;

a device layer disposed below the semiconductor substrate;

a front surface passivation layer disposed below the device layer and that provides a front surface;

a rear surface passivation layer disposed on the semiconductor substrate and that provides a rear surface;

front pads disposed below the front surface passivation layer; and rear pads connected to the through-electrodes and disposed on the rear surface passivation layer, wherein the plurality of insulating frames are in contact with the front surface passivation layer or the rear surface passivation layer.

18. A semiconductor package, comprising:

a plurality of semiconductor chips that face each other;

a plurality of bumps disposed on a front surface or a rear surface of one of the plurality of semiconductor chips;

an underfill layer that surrounds the plurality of bumps; and a plurality of insulating frames spaced apart from each other on the front or rear surface of the one of the plurality of semiconductor chips and also spaced apart from each of the plurality of bumps, wherein one of the plurality of insulating frames includes a plurality of boundary lines, and one boundary line among the plurality of boundary lines is oblique with respect to remaining boundary lines among the plurality of boundary lines, and the plurality of insulating frames and the underfill layer comprise different insulating materials.

19. The semiconductor package of claim 18, wherein the remaining boundary lines among the plurality of boundary lines are respectively parallel to boundary lines of one of a plurality of corner portions, on which the one of the plurality of insulating frames is disposed, and the plurality of bumps are disposed in a space between the plurality of insulating frames, and edge portions of two or more of the plurality of bumps are arranged side by side along the one boundary line of the one of the plurality of insulating frames.

* * * * *